（12）United States Patent
Ogo et al.

(10) Patent No.: US 11,417,555 B2
(45) Date of Patent: Aug. 16, 2022

(54) CEILING CONVEYANCE VEHICLE AND CEILING CONVEYANCE VEHICLE SYSTEM

(71) Applicant: MURATA MACHINERY, LTD., Kyoto (JP)

(72) Inventors: Haruki Ogo, Inuyama (JP); Yasuhisa Ito, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 0 days.

(21) Appl. No.: 17/289,312

(22) PCT Filed: Sep. 24, 2019

(86) PCT No.: PCT/JP2019/037290
§ 371 (c)(1),
(2) Date: Apr. 28, 2021

(87) PCT Pub. No.: WO2020/090288
PCT Pub. Date: May 7, 2020

(65) Prior Publication Data
US 2022/0020621 A1 Jan. 20, 2022

(30) Foreign Application Priority Data

Oct. 29, 2018 (JP) .............................. JP2018-203024

(51) Int. Cl.
*H01L 21/677* (2006.01)
*B61B 3/02* (2006.01)
(Continued)

(52) U.S. Cl.
CPC .......... *H01L 21/67715* (2013.01); *B61B 3/02* (2013.01); *B65G 67/02* (2013.01);
(Continued)

(58) Field of Classification Search
CPC ......... H01L 21/67715; H01L 21/67724; H01L 21/6773; H01L 21/67733; B61B 3/02;
(Continued)

(56) References Cited

U.S. PATENT DOCUMENTS 9,048,275 B2 * 6/2015 Murata ............. H01L 21/67379
9,881,824 B2 * 1/2018 Ito ........................... B66C 13/18
(Continued)

FOREIGN PATENT DOCUMENTS

JP          4702693 B2    6/2011
WO     2018/037762 A1    3/2018

OTHER PUBLICATIONS

Official Communication issued in International Patent Application No. PCT/JP2019/037290, dated Dec. 10, 2019.

*Primary Examiner* — Glenn F Myers
(74) *Attorney, Agent, or Firm* — Keating & Bennett, LLP

(57) ABSTRACT

A ceiling conveyance vehicle includes a traveling wheel to roll on a track including a first track and a second track and a main body below the track and coupled to the traveling wheel. The ceiling conveyance vehicle includes a direction changer to change between a first state in which the traveling wheel rolls on the first track and a second state in which the traveling wheel rolls on the second track, with an orientation of the main body with respect to the track maintained, an article holder capable of holding an article, a hoisting-and-lowering driver to hoist and lower the article holder, a lateral slider to slidingly move the hoisting-and-lowering driver in a horizontal, linear direction, and a first rotational driver to rotationally drive the lateral slider around a first perpendicular axis with respect to the main body.

6 Claims, 13 Drawing Sheets

(51) Int. Cl.
*B65G 67/02* (2006.01)
*B66C 7/02* (2006.01)
*B66C 11/00* (2006.01)
*B66C 13/08* (2006.01)
*B66C 19/00* (2006.01)

(52) U.S. Cl.
CPC ............... B66C 7/02 (2013.01); B66C 11/00 (2013.01); B66C 13/08 (2013.01); B66C 19/00 (2013.01); H01L 21/6773 (2013.01); H01L 21/67724 (2013.01); H01L 21/67733 (2013.01); *B65G 2201/0297* (2013.01)

(58) Field of Classification Search
CPC ............ B65G 67/02; B65G 2201/0297; B65G 1/0457; B65G 1/0464; B65G 1/0478; B66C 7/02; B66C 11/00; B66C 13/08; B66C 19/00
See application file for complete search history.

(56) References Cited

U.S. PATENT DOCUMENTS

| | | | | |
|---|---|---|---|---|
| 9,991,143 | B2 * | 6/2018 | Takai | H01L 21/67736 |
| 2007/0110547 | A1 * | 5/2007 | Doherty | B65G 1/0457 |
| | | | | 414/331.02 |
| 2018/0370725 | A1 * | 12/2018 | Hognaland | B65G 1/0464 |
| 2019/0047786 | A1 * | 2/2019 | Suzuki | H01L 21/67736 |
| 2019/0189488 | A1 | 6/2019 | Ito | |
| 2020/0223633 | A1 * | 7/2020 | Stadie | B65G 1/0457 |

* cited by examiner

CEILING CONVEYANCE VEHICLE AND CEILING CONVEYANCE VEHICLE SYSTEM

BACKGROUND OF THE INVENTION

1. Field of the Invention

The present invention relates to a ceiling conveyance vehicle and a ceiling conveyance vehicle system.

2. Description of the Related Art

In semiconductor manufacturing factories or the like, a ceiling conveyance vehicle system conveying articles such as front opening unified pods (FOUPs) housing semiconductor wafers or reticle pods housing reticles is being used, for example. As a ceiling conveyance vehicle used in this ceiling conveyance vehicle system, a configuration having a traveling wheel rolling on a track including a first track extending in a first direction and a second track extending in a second direction different from the first direction and a main body placed below the track and coupled to the traveling vehicle is known (refer to International Publication No. 2018/037762, for example). In this ceiling conveyance vehicle, the main body includes a direction changer to change between a first state in which the traveling wheel rolls on the first track and a second state in which the traveling wheel rolls on the second track, with an orientation of the main body with respect to the track maintained, an article holder capable of holding an article, a hoisting-and-lowering driver hoisting and lowering the article holder, and a lateral slider slidingly moving the hoisting-and-lowering driver in a linear direction on a horizontal plane.

In the ceiling conveyance vehicle described in International Publication No. 2018/037762, the configuration switches a traveling direction of the main body with the orientation of the main body with respect to the track maintained, and thus the orientation of the main body is maintained unchanged even when the traveling direction is switched between the first track and the second track. Consequently, when a direction of sliding movement by the lateral slider matches the traveling direction of the main body, there arises a problem in that the article holder cannot be moved in a direction other than the traveling direction (a direction perpendicular or substantially perpendicular to the traveling direction, for example), and a transfer position of an article cannot be adjusted.

SUMMARY OF THE INVENTION

Preferred embodiments of the present invention provide ceiling conveyance vehicles and a ceiling conveyance vehicle systems that can each easily adjust a transfer position of an article by slidingly moving a lateral slider in a desired direction.

A ceiling conveyance vehicle according to an aspect of a preferred embodiment of the present invention is a ceiling conveyance vehicle including a traveling wheel to roll on a track including a first track extending in a first direction and a second track extending in a second direction different from the first direction and a main body below the track and coupled to the traveling wheel, the ceiling conveyance vehicle including a direction changer to change between a first state in which the traveling wheel rolls on the first track and a second state in which the traveling wheel rolls on the second track, with an orientation of the main body with respect to the track maintained, an article holder capable of holding an article, a hoisting-and-lowering driver to hoist and lower the article holder, a lateral slider to slidingly move the hoisting-and-lowering driver in a horizontal, linear direction, and a first rotational driver to rotationally drive the lateral slider around a first perpendicular axis with respect to the main body.

A second rotationally driver to rotationally drive the article holder or the hoisting-and-lowering driver around a second perpendicular axis with respect to the lateral slider may be included. The second rotationally driver may rotate the article holder or the hoisting-and-lowering driver in a range of at least 180 degrees around the second perpendicular axis based on the linear direction. The track may be a grid-shaped track in which the first direction and the second direction are perpendicular or substantially perpendicular to each other, the lateral slider may one-sidedly slidingly move the hoisting-and-lowering driver in one direction in the linear direction, and the first rotational driver may rotate the lateral slider in a range of 270 degrees around the first perpendicular axis from a state in which a direction of one-sided sliding movement of the lateral slider is aligned with the first direction or the second direction.

A controller to drive the first rotational driver to rotate the lateral slider around the first perpendicular axis while moving toward a transfer position to perform transfer of an article with respect to a transfer destination may be included. The controller may set a rotational position of the lateral slider such that the linear direction in which the lateral slider slidingly moves and the transfer destination overlap with each other in a plan view when the main body has stopped at the transfer position.

A ceiling conveyance vehicle system according to an aspect of a preferred embodiment of the present invention is a ceiling conveyance vehicle system including a track including a first track extending in a first direction and a second track extending in a second direction different from the first direction and a ceiling conveyance vehicle traveling along the track, the ceiling conveyance vehicle being the ceiling conveyance vehicle.

With the ceiling conveyance vehicle and the ceiling conveyance vehicle system, the lateral slider is rotatable around the first perpendicular axis with respect to the main body, and thus the lateral slider can be slidingly moved in a desired direction when the traveling direction of the main body is any one of the first track and the second track. Consequently, even when the direction of the sliding movement by the lateral slider and the traveling direction of the main body match, the article holder can be moved in a direction other than the traveling direction such as a direction perpendicular or substantially perpendicular to the traveling direction, and the transfer position of the article can easily be adjusted.

In the configuration in which the second rotationally driver to rotationally drive the article holder or the hoisting-and-lowering driver around a second perpendicular axis with respect to the lateral slider is included, the orientation of the article held by the hoisting-and-lowering driver can be changed, and even a case in which the orientation of the article is specified at a transfer destination can be coped with. In the configuration in which the second rotationally driver rotates the article holder or the hoisting-and-lowering driver in a range of at least 180 degrees around the second perpendicular axis based on the linear direction, the article held by the article holder can be directed to an opposite direction around the second perpendicular axis. In the configuration in which the track is a grid-shaped track in which the first direction and the second direction are perpendicular or substantially perpendicular to each other, the lateral slider one-sidedly slidingly moves the hoisting-and-lowering driver in one direction in the linear direction, and the first rotational driver rotates the lateral slider in a range of 270 degrees around the first perpendicular axis from a state in which a direction of one-sided sliding movement of the lateral slider is aligned with the first direction or the second direction, when the lateral slider is one-sided sliding movement, the article holder can be slidingly moved in any direction of the first direction and the second direction from the main body stationary on the grid-shaped track.

In the configuration in which the controller driving the first rotational driver to rotate the lateral slider around the first perpendicular axis while moving toward a transfer position to perform transfer of an article with respect to a transfer destination is included, the lateral slider is rotated while the main body is traveling, and thus the time required for the transfer of the article M can be reduced. In the configuration in which the controller sets a rotational position of the lateral slider such that the linear direction in which the lateral slider slidingly moves and the transfer destination overlap with each other in a plan view when the main body has stopped at the transfer position, a transfer operation for the article can quickly be performed after the main body has reached the transfer position.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
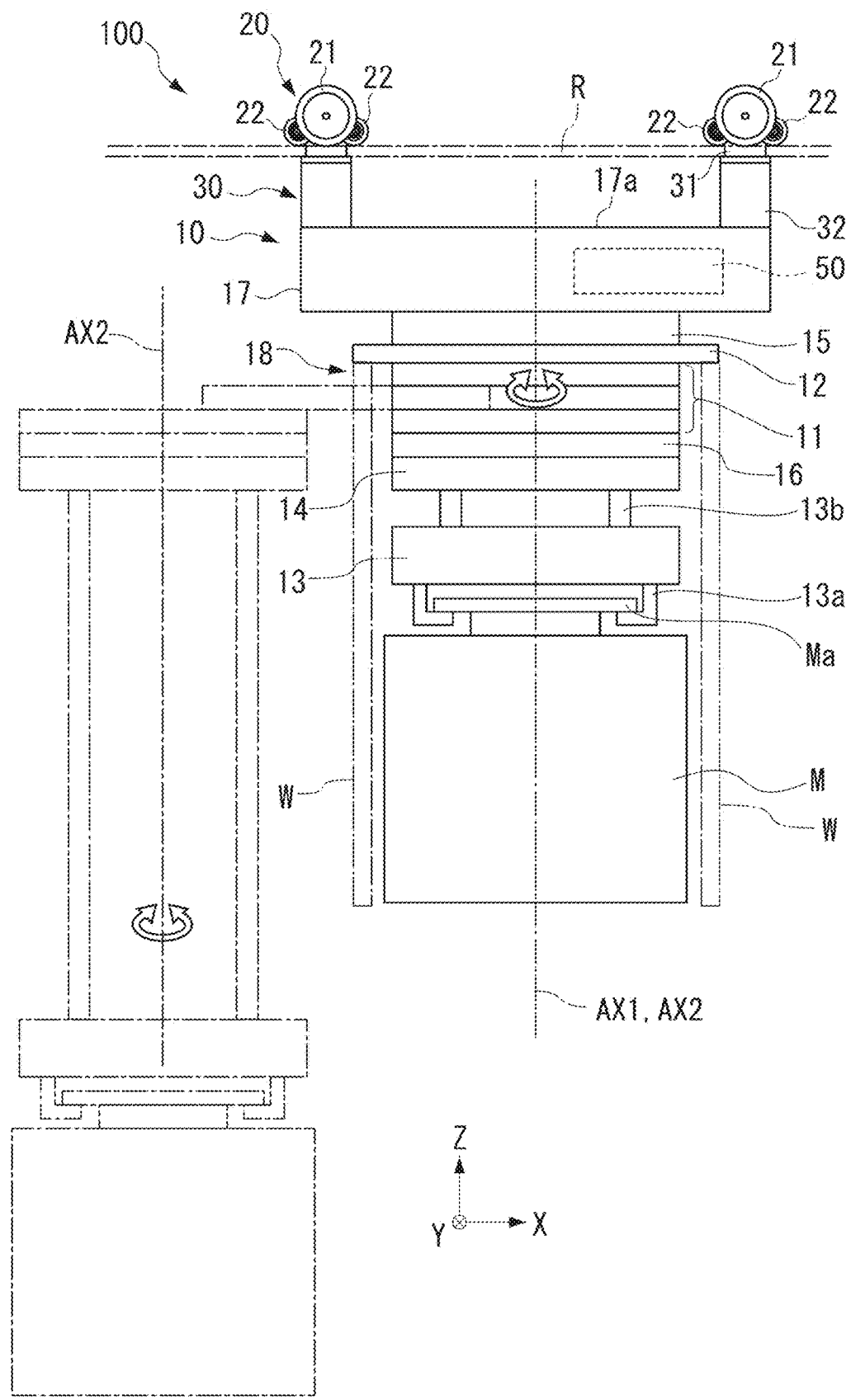
FIG. 1 is a side view illustrating an example of a ceiling conveyance vehicle according to a first preferred embodiment of the present invention.

The following describes preferred embodiments of the present invention with reference to the accompanying drawings. However, the present invention is not limited to the aspects described below. To describe the preferred embodiments, the drawings are represented with a scale changed as appropriate such as in a partially enlarged or emphasized manner. In the drawings below, directions in the drawings are described using an XYZ coordinate system. In this XYZ coordinate system, a plane parallel to a horizontal plane is defined as an XY plane. A linear direction along this XY plane is denoted by an X direction, whereas a direction perpendicular or substantially perpendicular to the X direction is denoted by a Y direction. A traveling direction of a ceiling conveyance vehicle 100 can be changed from the state illustrated in the drawings below to another direction, and the ceiling conveyance vehicle 100 may travel in a curvilinear direction, for example. A direction perpendicular to the XY plane is denoted by a Z direction. Each of the X direction, the Y direction, and the Z direction is described with the direction indicated by the arrow in the drawings as a + direction and with the opposite direction as a − direction. A rotational direction around a Z axis is denoted by a θZ direction.

First Preferred Embodiment

Figure 2:
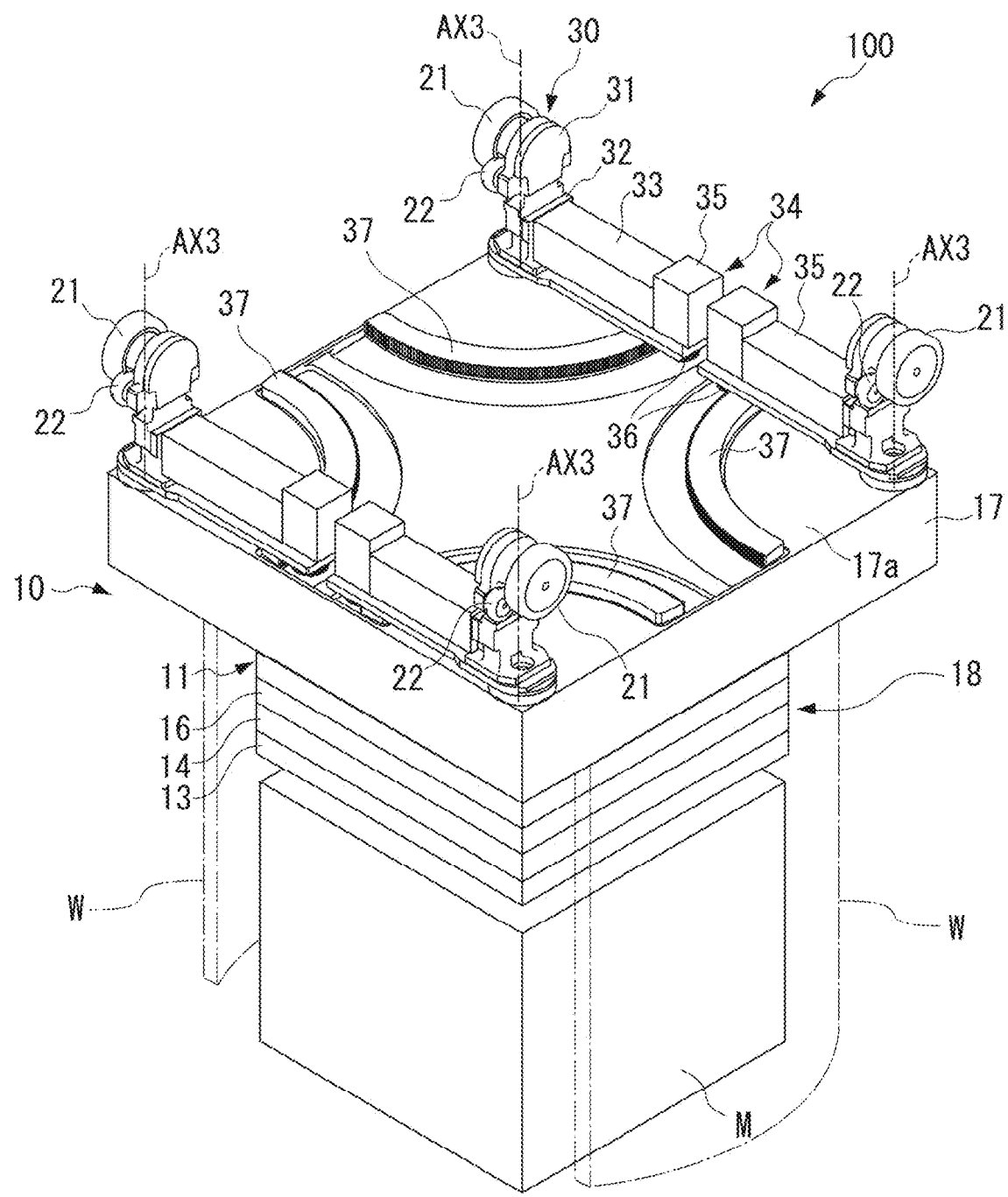
FIG. 2 is a perspective view of the ceiling conveyance vehicle illustrated in FIG. 1.
Figure 3:
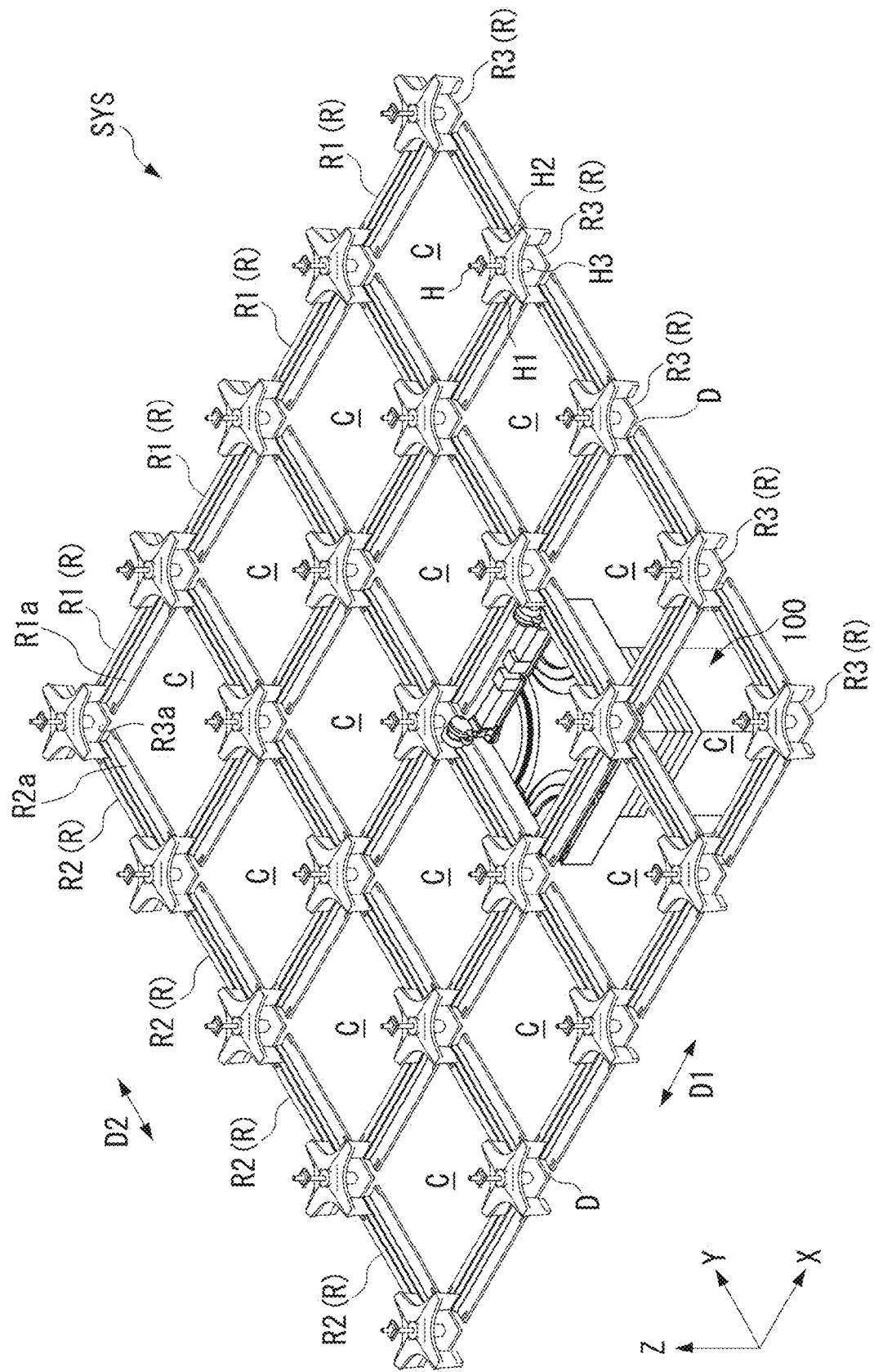
FIG. 3 is a perspective view illustrating an example of a ceiling conveyance vehicle system according to the present preferred embodiment of the present invention.

FIG. 1 is a side view illustrating an example of a ceiling conveyance vehicle 100 according to a first preferred embodiment. FIG. 2 is a perspective view of the ceiling conveyance vehicle 100 illustrated in FIG. 1. FIG. 3 is a perspective view illustrating an example of a ceiling conveyance vehicle system SYS according to the present preferred embodiment. As illustrated in FIG. 1 to FIG. 3, the ceiling conveyance vehicle 100 moves along a track R of the ceiling conveyance vehicle system SYS to convey an article M such as a front opening unified pod (FOUP) housing semiconductor wafers or a reticle pod housing reticles. The ceiling conveyance vehicle 100 travels near the ceiling of a building and may thus be referred to as a ceiling traveling vehicle.

The ceiling conveyance vehicle system SYS is a system to convey the article M by the ceiling conveyance vehicle 100 in a clean room of a semiconductor manufacturing factory, for example. In the ceiling conveyance vehicle system SYS, a plurality of ceiling conveyance vehicles 100 may be used, for example. The ceiling conveyance vehicles 100 convey the article M, thereby enabling high-density conveyance, and the conveyance efficiency of the article M can be improved.

The track R is one aspect of a track. The track R is laid on the ceiling of the building such as a clean room or near the ceiling. The track R is a grid-shaped track including a first track R1, a second track R2, and a connection track R3 (refer to FIG. 3). Hereinafter, the track R is referred to as a grid-shaped track R. The first track R1 is provided along the X direction (a first direction D1). The second track R2 is provided along the Y direction (a second direction D2). In the present preferred embodiment, the first direction D1 and the second direction D2 are perpendicular or substantially perpendicular to each other, and a plurality of first tracks R1 and a plurality of second tracks R2 extend along directions perpendicular or substantially perpendicular to each other but do not directly cross each other. The connection track R3 is at a crossing portion between the first track R1 and the second track R2. The first tracks R1 and the second tracks R2 extend along the directions perpendicular or substantially perpendicular to each other such that the grid-shaped track R is in a state in which a plurality of cells C (sections) are adjacent to each other in a plan view. FIG. 3 illustrates a portion of the grid-shaped track R, and in the grid-shaped track R, a similar configuration is continuously provided in the first direction D1 (the X direction) and the second direction D2 (the Y direction) from the illustrated configuration.

The first track R1, the second track R2, and the connection track R3 are hung on the ceiling (not illustrated) with a hanger H (refer to FIG. 3). The hanger H includes a first portion H1 to hang the first track R1, a second portion H2 to hang the second track R2, and a third portion H3 to hang the connection track R3. First portions H1 and second portions H2 are each provided at two locations across the third part H3.

The first track R1, the second track R2, and the connection track R3 include traveling surfaces R1a, R2a, and R3a, respectively, on which a traveling wheel 21 described below of the ceiling conveyance vehicles 100 travels. A gap D is provided between the first track R1 and the connection track R3 and between the second track R2 and the connection track R3. The gap D is a portion over which a coupler 30 described below as part of the ceiling conveyance vehicles 100 passes when the ceiling conveyance vehicles 100 travels along the first track R1 to cross the second track R2 or when the ceiling conveyance vehicles 100 travels along the second track R2 to cross the first track R1. Consequently, the gap D is provided in a width enabling the coupler 30 to pass thereover. The first track R1, the second track R2, and the connection track R3 are provided along the same or substantially the same horizontal plane. In the present preferred embodiment, the first track R1, the second track R2, and the connection track R3 position the traveling surfaces R1a, R2a, and R3a on the same or substantially the same horizontal plane.

As illustrated in FIG. 1 and FIG. 2, the ceiling conveyance vehicle 100 includes a main body 10, travelers 20, couplers 30, and a controller 50. The controller 50 collectively controls operations of the respective parts of the ceiling conveyance vehicle 100. Although the controller 50 is provided in the main body 10, it may be provided outside the main body 10. The main body 10 is located below (on the −Z side of) the grid-shaped track R. The main body 10 preferably has a rectangular or substantially rectangular shape, for example, in a plan view. The main body 10 has dimensions housed in one cell C in the track R in a plan view. Thus, a space in which one ceiling conveyance vehicle 100 passes another ceiling conveyance vehicle 100 traveling along an adjacent first track R1 or second track R2 is ensured.

The main body 10 includes an upper portion 17 and a transfer apparatus 18. The upper portion 17 is hung on the travelers 20 via the couplers 30. The upper portion 17 is rectangular or substantially rectangular in a plan view, for example, and includes four corner portions in an upper surface 17a. The main body 10 has the traveling wheel 21, the coupler 30, and a direction changer 34 in each of the four corner portions.

The transfer apparatus 18 is provided below the upper portion 17. The transfer apparatus 18 can rotate around a first perpendicular axis AX1 in a vertical direction. The transfer apparatus 18 includes an article holder 13 to hold the article M, a hoisting-and-lowering driver 14 to hoist and lower the article holder 13 in the vertical direction, a lateral slider 11 to slidingly move the hoisting-and-lowering driver 14, a rotator 12 to hold the lateral slider 11, a first rotational driver 15 to rotationally drive the lateral slider 11 around the first perpendicular axis AX1 with respect to the main body 10, and a second rotational driver 16 to rotationally drive the hoisting-and-lowering driver 14 around a second perpendicular axis AX2 with respect to the lateral slider 11.

The lateral slider 11 includes a plurality of movable plates stacked in the Z direction, for example. The movable plates are movable in the Y direction. The second rotational driver 16 is mounted on a lowermost movable plate. The lateral slider 11 moves the movable plates by a drive apparatus (not illustrated) and can thus one-sidedly slidingly move the hoisting-and-lowering driver 14 mounted on the lowermost movable plate and the article holder 13 in one direction with respect to the traveling direction, that is, in one direction in a linear direction. The rotator 12 is mounted on the first rotational driver 15 between the lateral slider 11 and the upper portion 17 to hold the lateral slider 11.

The article holder 13 grasps a flange Ma of the article M to hang and hold the article M. The article holder 13 is a chuck including a horizontally movable hook 13a, for example, causes the hook 13a to enter below the flange Ma of the article M, and hoists the article holder 13 to hold the article M. The article holder 13 is connected to a hanger 13b such as a wire or a belt.

The hoisting-and-lowering driver 14 is mounted on the second rotational driver 16. The hoisting-and-lowering driver 14 includes a hoist, for example, draws out the hanger 13b to lower the article holder 13, and winds up the hanger 13b to hoist the article holder 13. The hoisting-and-lowering driver 14 is controlled by the controller 50 to lower or hoist the article holder 13 at a certain speed. The hoisting-and-lowering driver 14 is controlled by the controller 50 to hold the article holder 13 at a target height.

The first rotational driver 15, for which an electric motor or the like is used, rotates the rotator 12 around the first perpendicular axis AX1. The first rotational driver 15 can rotate the lateral slider 11 around the first perpendicular axis AX1 together with the rotation of the rotator 12. When the first rotational driver 15 rotates the lateral slider 11 around the first perpendicular axis AX1, the second rotational driver 16, the hoisting-and-lowering driver 14, and the article holder 13 mounted on a lower side of the lateral slider 11 integrally rotate around the first perpendicular axis AX1. The second rotational driver 16, for which an electric motor or the like is preferably used, rotates the hoisting-and-lowering driver 14 around the second perpendicular axis AX2.

Figure 4:
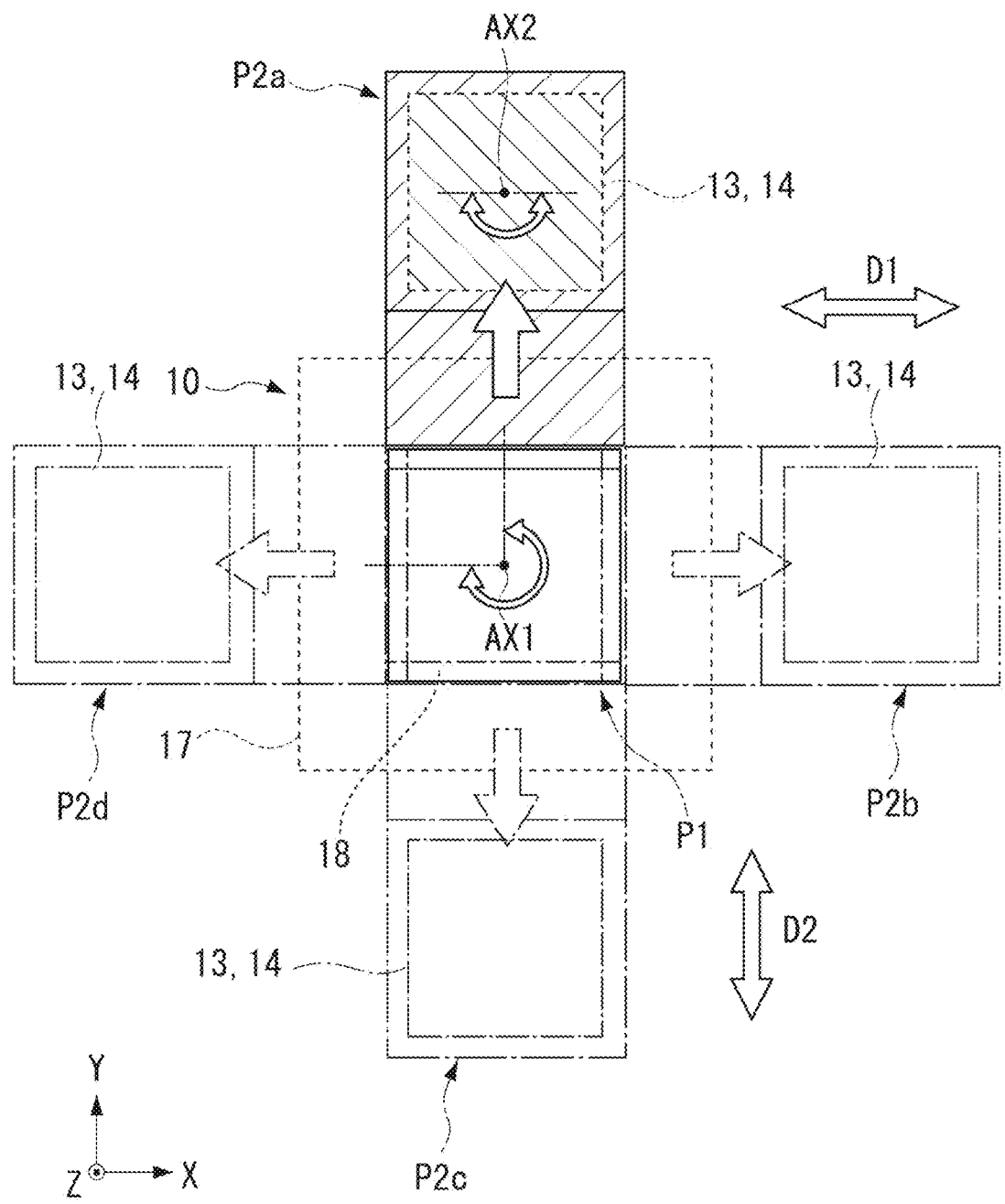
FIG. 4 is a diagram schematically illustrating a state in which a main body is viewed from above.

FIG. 4 is a diagram schematically illustrating a state in which the main body 10 is viewed from above. FIG. 4 illustrates an example of rotational movement of the lateral slider 11 and the hoisting-and-lowering driver 14. As illustrated in FIG. 4, the first rotational driver 15 can rotate the lateral slider 11 in a range of 270 degrees around the first perpendicular axis AX1 from a state in which a direction of one-sided sliding movement of the lateral slider 11 is aligned with the first direction D1 or the second direction D2. Thus, the direction of the one-sided sliding movement of the lateral slider 11 rotates by an angle by which the lateral slider 11 has rotated. In this case, the article holder 13 can be one-sidedly slidingly moved in any direction of the first direction D1 and the second direction D2 from the main body 10 stationary on the grid-shaped track R. The rotation range is limited to 270 degrees, not 360 degrees, such that a mechanical stopper for the first rotational driver 15 can easily be installed. Damage that wiring (not illustrated) connected to the first rotational driver 15 receives during rotation can be reduced.

The lateral slider 11 may be able to slidingly move the hoisting-and-lowering driver 14 and the article holder 13 in both directions in the linear direction. In this configuration, the first rotational driver 15 may rotate the lateral slider 11 in a range of 90 degrees around the first perpendicular axis AX1 from the state in which the direction of the sliding movement of the lateral slider 11 is aligned with the first direction D1 or the second direction D2. In this case, the article holder 13 can be slidingly moved in any direction of the first direction D1 and the second direction D2 from the main body 10 stationary on the grid-shaped track R.

The transfer apparatus 18 drives the lateral slider 11 to enable the hoisting-and-lowering driver 14 and the article holder 13 to protrude from a transfer position P1 below the upper portion 17 to any of protruding positions P2a, P2b, P2c, and P2d. The protruding position P2a is a protruding position when the hoisting-and-lowering driver 14 and the article holder 13 are slidingly moved in the +Y direction by the lateral slider 11. The protruding position P2b is a protruding position when the lateral slider 11 is rotated by 90 degrees (clockwise 90 degrees, for example) around the first perpendicular axis AX1 by the first rotational driver 15, and the hoisting-and-lowering driver 14 and the article holder 13 are slidingly moved in the +X direction by the lateral slider 11. The protruding position P2c is a protruding position when the lateral slider 11 is rotated by 180 degrees around the first perpendicular axis AX1 by the first rotational driver 15, and the hoisting-and-lowering driver 14 and the article holder 13 are slidingly moved in the −Y direction by the lateral slider 11. The protruding position P2d is a protruding position when the lateral slider 11 is rotated by 270 degrees around the first perpendicular axis AX1 by the first rotational driver 15, and the hoisting-and-lowering driver 14 and the article holder 13 are slidingly moved in the −X direction by the lateral slider 11.

Thus, although the lateral slider 11 one-sidedly slidingly moves the hoisting-and-lowering driver 14 and the article holder 13 in one direction in the linear direction, the first rotational driver 15 is driven to set a rotational position of the lateral slider 11 at 90-degree intervals to enable the hoisting-and-lowering driver 14 and the article holder 13 to be slidingly moved in each of four directions, namely the +X direction (the first direction D1), the +Y direction (the second direction D2), the −X direction (the first direction D1), and the −Y direction (the second direction D2).

The second rotational driver 16, for which an electric motor or the like is used, rotates the hoisting-and-lowering driver (the article holder 13) at least in a range of 180 degrees around the second perpendicular axis AX2 based on the linear direction in which the one-sided sliding movement is performed by the lateral slider 11. Although FIG. 4 illustrates an aspect in which the hoisting-and-lowering driver 14 (the article holder 13) can be rotated by 180 degrees around the second perpendicular axis AX2 in a range of a direction indicated by the dotted dashed line passing through the second perpendicular axis AX2 (a direction perpendicular or substantially perpendicular to the linear direction), this aspect is not limiting. The direction indicated by the dotted dashed line in FIG. 4 may match the linear direction in which the one-sided sliding movement is performed by the lateral slider 11, for example. According to the aspect illustrated in FIG. 4, the second rotational driver 16 is driven, such that a state in which the front side of the article M is directed to the +X direction is rotated by 180 degrees around the second perpendicular axis AX2, such that the front side of the article M can be directed to the −X direction (that is, the opposite direction), for example. The hoisting-and-lowering driver 14 (the article holder 13) is rotated by 90 degrees by the second rotational driver 16, such that the state in which the front side of the article M is directed to the +X direction can be made to a state in which the front side of the article M is directed to the +Y direction or the −Y direction.

As illustrated in FIG. 1 and FIG. 2, a traveler 20 includes the traveling wheel 21 and auxiliary wheels 22. Traveling wheels 21 are at the four respective corner portions of the upper surface 17a of the upper portion 17 (the main body 10). Each of the traveling wheels 21 is mounted on a wheel shaft (not illustrated) provided in the coupler 30. The wheel shaft is parallel or substantially parallel to the XY plane. Each of the traveling wheels 21 is rotationally driven by the driving force of a traveling driver 33 described below. Each of the traveling wheels 21 rolls on the traveling surfaces R1a, R2a, and R3a of the first track R1, the second track R2, and the connection track R3, respectively, in the grid-shaped track R to cause the ceiling conveyance vehicle 100 to travel. Without being limited to rotationally driving all the four traveling wheels 21 by the driving force of the traveling driver 33, some of the four traveling wheels 21 may be rotationally driven.

The traveling wheel 21 can turn in the θZ direction around a turning axis AX3. The traveling wheel 21 is turned in the θZ direction by the direction changer 34 described below and can consequently change the traveling direction of the ceiling conveyance vehicle 100. One auxiliary wheel 22 is provided on each of the front and rear in the traveling direction of the traveling wheel 21. Each of the auxiliary wheels 22, like the traveling wheel 21, is rotatable in the θZ direction. A lower end of the auxiliary wheels 22 is higher than a lower end of the traveling wheel 21. Consequently, when the traveling wheel 21 is traveling on the traveling surfaces R1a, R2a, and R3a, the auxiliary wheels 22 are not in contact with the traveling surfaces R1a, R2a, and R3a. When the traveling wheel 21 passes over the gap D (refer to FIG. 3), the auxiliary wheels 22 come into contact with the traveling surfaces R1a, R2a, and R3a to prevent the traveling wheel 21 from falling. Without being limited to providing two auxiliary wheels 22 for one traveling wheel 21, one auxiliary wheel 22 may be provided for one traveling wheel 21, or no auxiliary wheels 22 may be provided, for example.

As illustrated in FIG. 1 and FIG. 2, the ceiling conveyance vehicle 100 may be provided with a cover W so as to surround the transfer apparatus 18 and the article M held by the transfer apparatus 18. The cover W has a tubular shape with a lower end open with a portion through which the movable plates of the lateral slider 11 protrude (a portion through which they slidingly move) notched. The cover W, the upper end of which is mounted on the rotator 12, rotates around the first perpendicular axis AX1 along with the rotation of the rotator 12.

The couplers 30 couple the upper portion 17 of the main body 10 and the travelers 20 to each other. The couplers 30 are provided at the four respective corner portions of the upper surface 17a of the upper portion 17 (the main body 10). The main body 10 is caused to hang by these couplers 30 below the grid-shaped track R. The coupler 30 includes a support 31 and a connector 32. The support 31 rotatably supports a rotation axis of the traveling wheel 21 and rotation axes of the auxiliary wheels 22. The support 31 holds a relative position among the traveling wheel 21 and the auxiliary wheels 22. The support 31 preferably have a plate shape, for example, and preferably has a thickness capable of passing over the gap D.

The connector 32 extends downward from the support 31 to be coupled to the upper surface 17a of the upper portion 17 and to hold the upper portion 17. The connector 32 includes a transmitter to transmit the driving force of the traveling driver 33 described below to the traveling wheel 21 therewithin. For this transmitter, a chain or a belt may be used, or a gear train may be used. The connector 32 is provided rotatably in the θZ direction around the turning axis AX3. This connector 32 rotates around the turning axis AX3 to enable the traveling wheel 21 to turn in the θZ direction.

The coupler 30 includes the traveling driver 33 and the direction changer 34. The traveling driver 33 is mounted on the connector 32. The traveling driver 33 is a driving source to drive the traveling wheel 21, and an electric motor or the like is used therefor, for example. The four traveling wheels 21 are each driven by the traveling driver 33 to define and function as the drive wheels. The four traveling wheels 21 are controlled by the controller 50 so as to have the same or substantially the same number of rotations. When any of the four traveling wheels 21 is not used as the drive wheel, the traveling driver 33 is not mounted on its connector 32.

The direction changer 34 turns the connector 32 of the coupler 30 around the turning axis AX3 with respect to the main body 10 to turn the traveling wheel 21 in the θZ direction. The traveling wheel 21 is turned in the θZ direction such that a first state in which the traveling direction of the ceiling conveyance vehicle 100 is the first direction D1 can be switched to a second state in which the traveling direction is the second direction D2, or the second state, in which the traveling direction is the second direction D2, can be switched to the first state, in which the traveling direction is the first direction D1.

The direction changer 34 includes a driving source 35, a pinion gear 36, and a rack 37. The driving source 35 is mounted on a side surface of the traveling driver 33 separate from the turning axis AX3. For the driving source 35, an electric motor or the like is used, for example. The pinion gear 36 is mounted on a lower surface side of the driving source 35 and is rotationally driven in the θZ direction through driving force generated by the driving source 35. The pinion gear 36 is circular in a plan view and includes a plurality of teeth in a circumferential direction on its perimeter. The rack 37 is fixed to the upper surface 17a of the upper portion 17. Racks 37 are provided at the four respective corner portions of the upper surface 17a of the upper portion 17 and are each provided in an arc shape (a fan shape) around the turning axis AX3 of the traveling wheel 21. The rack 37 includes a plurality of teeth meshing with the teeth of the pinion gear 36 in a circumferential direction on its perimeter.

The pinion gear 36 and the rack 37 are positioned such that the mutual teeth mesh with each other. The pinion gear 36 rotates in the θZ direction, such that the pinion gear 36 moves in a circumferential direction around the turning axis AX3 so as to follow the perimeter of the rack 37. With this movement of the pinion gear 36, the connector 32 turns, and the traveling driver and the direction changer 34 turn in the circumferential direction around the turning axis AX3 together with the pinion gear 36.

By the turning of the direction changer 34, the traveling wheels 21 and the auxiliary wheels 22 located at the four respective corner portions of the upper surface 17a turn in a range of 90 degrees in the θZ direction around the turning axis AX3. The drive of the direction changer 34 is controlled by the controller 50. The controller 50 may provide an instruction to perform turning operations of the four traveling wheels 21 at the same time or instruct to perform them at different times. The traveling wheels 21 and the auxiliary wheels 22 are turned such that a state in which the traveling wheels 21 are in contact with one of the first track R1 and the second track R2 shifts to a state in which the traveling wheels 21 are in contact with the other. Thus, the first state, in which the traveling direction of the ceiling conveyance vehicle 100 is the first direction D1 (the X direction), and the second state, in which the traveling direction is the second direction D2 (the Y direction), can be switched to each other.

Figure 5A:
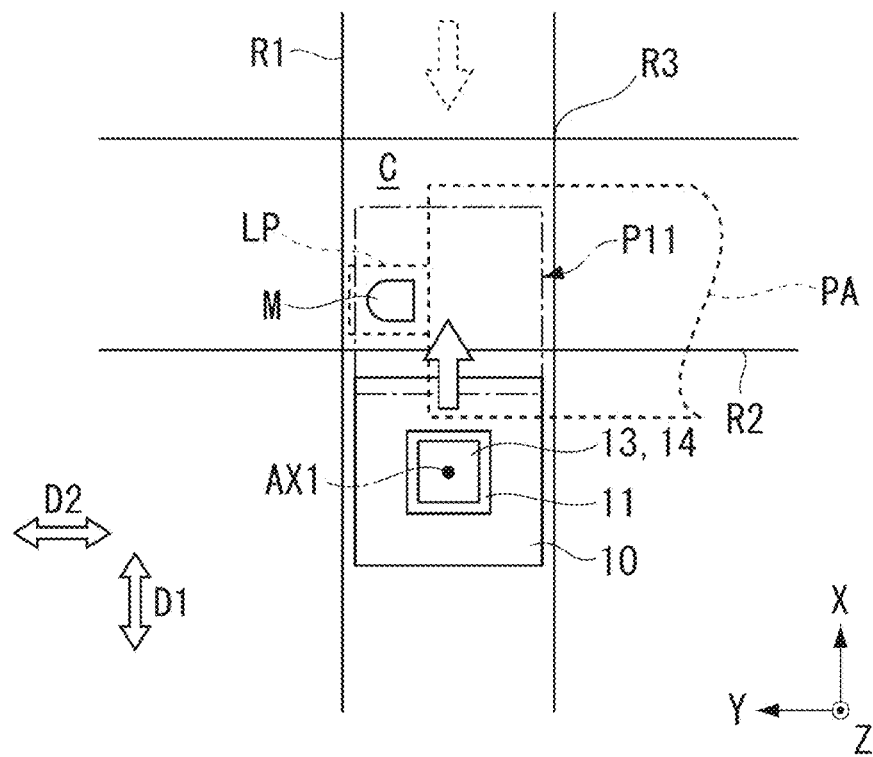
FIGS. 5A and 5B are plan views illustrating an example of a relation between a traveling direction of the main body and a sliding movement direction of a lateral slider.
Figure 5B:
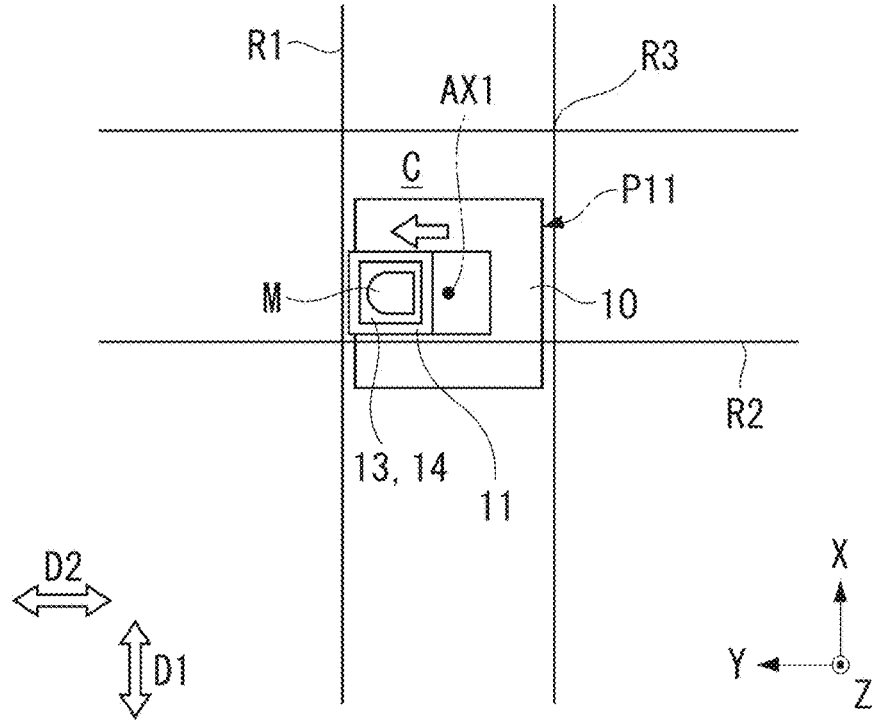
Figure 6A:
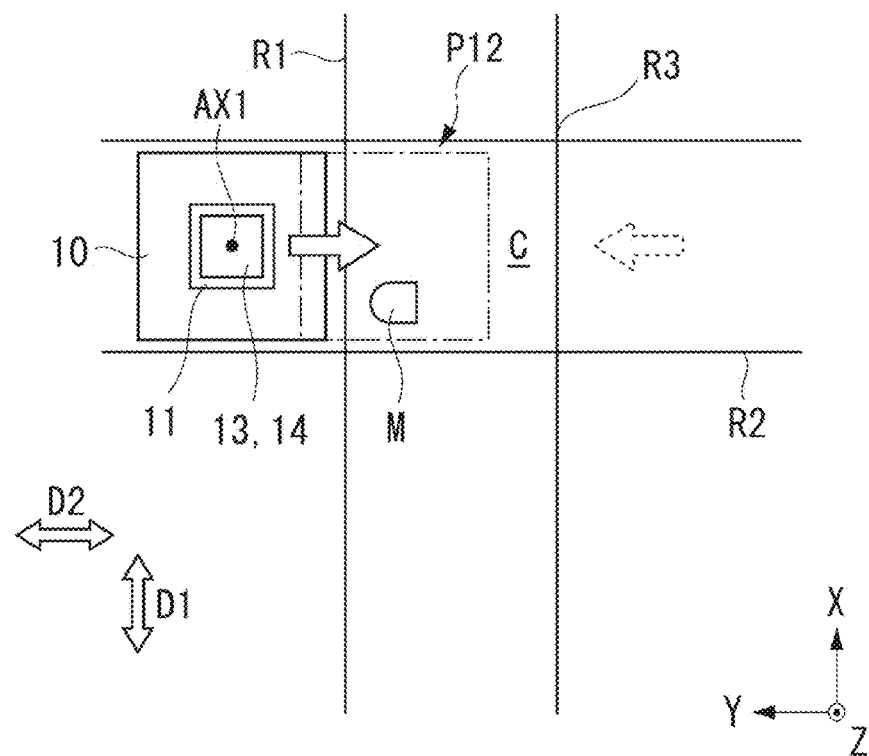
FIGS. 6A and 6B are plan views illustrating another example of the relation between the traveling direction of the main body and the sliding movement direction of the lateral slider.
Figure 6B:
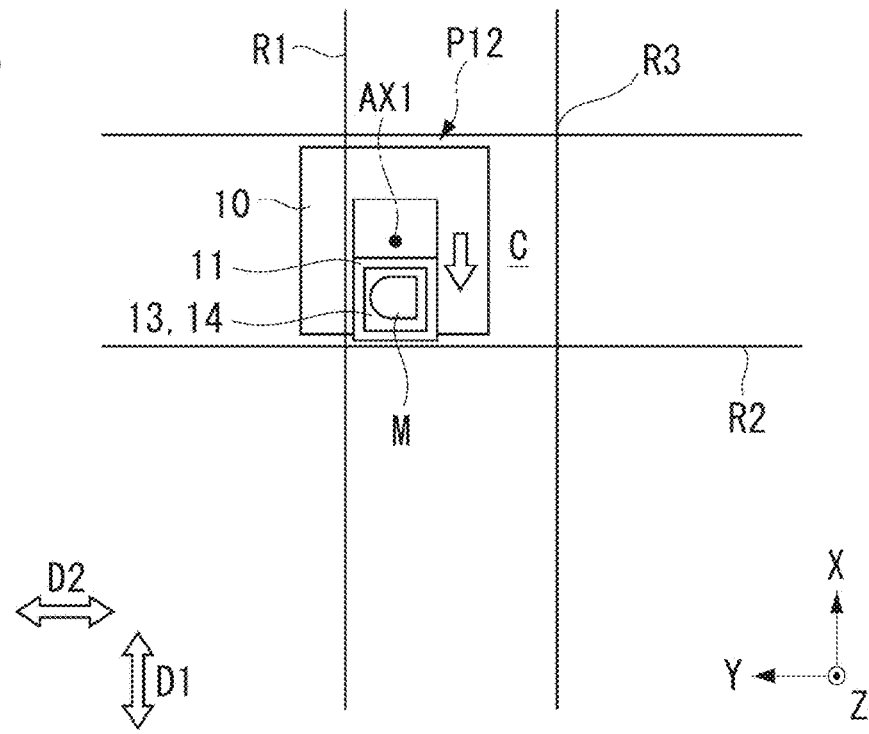

FIGS. 5A and 5B and FIGS. 6A and 6B are plan views illustrating examples of a relation between the traveling direction of the main body 10 and a sliding movement direction of the lateral slider 11. In FIGS. 5A and 5B and FIGS. 6A and 6B, the first track R1, the second track R2, and the connection track R3 are illustrated in a simplified manner. FIGS. 5A and 5B illustrate examples of a case in which the main body 10 moves in the first direction D1. FIGS. 6A and 6B illustrate examples of a case in which the main body 10 moves in the second direction D2. In FIGS. 5A and 5B and FIGS. 6A and 6B, the article M is at a position deviated from a central portion of an area surrounded by the first track R1 and the second track R2 in a plan view (refer to the cell C in FIG. 3). The article M being deviated from the central portion of the cell C in a plan view includes a case in which although the article M is at substantially the center of the cell C, it is only a little deviated to one rail. That is, a case in which the article M can be received and delivered by hoisting and lowering the article holder 13 with the ceiling conveyance vehicle 100 stopped at a position at which the central portion of the main body 10 matches the central portion of the cell C is a state in which the article M is at the central portion of the cell C (the article M is not deviated from the central portion); in other cases, when the article M is received and delivered by hoisting and lowering the article holder 13, sliding movement of the lateral slider 11 is required, and they are included in a state in which the article M is deviated from the central portion of the cell C in a plan view.

In FIGS. 5A and 5B and FIGS. 6A and 6B, a side of the article M is illustrated in a curved manner. In the article M, this curved portion indicates a rear side of the article M, whereas the side facing the curved portion indicates a front side. As illustrated in FIG. 5A, the article M is on a load port LP of a processing apparatus PA. The load port LP is an example of a transfer destination of the article M. The processing apparatus PA and the load port LP are below the grid-shaped track R. The processing apparatus PA and the load port LP are denoted in FIG. 5A, whereas they are omitted in the other drawings.

As illustrated in FIG. 5A, the ceiling conveyance vehicle 100 is in a state in which the main body 10 is traveling in the first direction D1 (the +X direction) toward a transfer position P11 in order to receive the article M. When reaching the transfer position P1, the main body 10 stops traveling. The same holds true for a case in which the main body 10 travels in the −X direction toward the transfer position P11. In the present preferred embodiment, the transfer position is a stopping position of the ceiling conveyance vehicle 100 to transfer the article M. In a state in which the main body 10 has stopped traveling at the transfer position P11, the article M is at a position corresponding to the central portion of the main body 10 for the first direction D1 and deviated to the +Y side with respect to the central portion of the main body 10 for the second direction D2. Consequently, the main body 10 rotates the lateral slider 11 by the first rotational driver 15 so as to enable the lateral slider 11 to slidingly move toward the +Y side from the transfer position P11.

After the lateral slider 11 is rotated, as illustrated in FIG. 5B, the main body 10 slidingly moves the lateral slider 11 toward the +Y side to cause the hoisting-and-lowering driver 14 to be above (on the +Z side of) the article M. In this state, the main body 10 lowers the article holder 13 by the hoisting-and-lowering driver 14 to cause the article holder 13 to hold the article M. The main body 10 then hoists the article holder 13 and slidingly moves the lateral slider 11 toward the −Y side and can house the hoisting-and-lowering driver 14, the article holder 13, and the article M.

As illustrated in FIG. 6A, the ceiling conveyance vehicle 100 is in a state in which the main body 10 is traveling in the second direction D2 (the −Y direction) toward a transfer position P12 in order to receive the article M. When reaching the transfer position P12, the main body 10 stops traveling. The same holds true for a case in which the main body 10 travels in the +Y direction toward the transfer position P12. In a state in which the main body 10 has stopped traveling at the transfer position P12, the article M is at a position corresponding to the central portion of the main body 10 for the second direction D2 and deviated to the −X side with respect to the central portion of the main body 10 for the first direction D1. The main body 10 rotates the lateral slider 11 by the first rotational driver 15 so as to enable the lateral slider 11 to slidingly move toward the −X side from the transfer position P12.

After rotating the lateral slider 11, as illustrated in FIG. 6B, the main body 10 slidingly moves the lateral slider 11 toward the −X side to cause the hoisting-and-lowering driver 14 to be above (on the +Z side of) the article M. In this state, the main body 10 lowers the article holder 13 by the hoisting-and-lowering driver 14 to cause the article holder 13 to hold the article M. The main body 10 then hoists the article holder 13 to slidingly move the lateral slider 11 toward the +X side and can house the hoisting-and-lowering driver 14, the article holder 13, and the article M.

Thus, the main body 10 rotates the lateral slider 11 by the first rotational driver 15, such that, for the article M deviated from the central portion of the cell C in a plan view, reception and delivery from and to the load port LP as the transfer destination of the article M are enabled in both a case in which the first track R1 is the transfer position P11 and a case in which the second track R2 is the transfer position P12. Consequently, either the transfer position P11 or the transfer position P12 may be selected depending on a direction in which the ceiling conveyance vehicle 100 approaches the article M, and the time required for the transfer of the article M is reduced, such that article conveyance efficiency can be improved. When the article M is delivered to the transfer destination (the load port LP), an operation opposite to the operation described above is performed.

In a configuration in which the lateral slider 11 cannot be rotated in the ceiling conveyance vehicle 100, when the sliding movement direction of the lateral slider 11 is the first direction D1 in the configuration in FIG. 5A, for example, in a state traveling along the first track R1, the ceiling conveyance vehicle 100 cannot receive or deliver the article M and cannot receive or deliver the article M unless the traveling direction is switched from the first track R1 to the second track R2, then a state in which the ceiling conveyance vehicle 100 travels along the second track R2 is given, and then the lateral slider 11 is slidingly moved in the first direction D1. Thus, when switching of the traveling direction of the ceiling conveyance vehicle 100 is required during the transfer of the article M, it takes time for the switching, leading to a reduction in the conveyance efficiency of the article M.

FIGS. 7A and 7B to FIG. 11 are plan views illustrating relations between the direction of the sliding movement of the lateral slider 11 and the orientation of the article M. In FIGS. 7A and 7B to FIG. 11, the first track R1, the second track R2, and the connection track R3 are illustrated in a simplified manner. FIGS. 7A and 7B to FIG. 11 illustrate examples in which the article M is delivered to a transfer destination deviated from the central portion of the area surrounded by the first track R1 and the second track R2 in a plan view (refer to the cell C in FIG. 3). In the article M illustrated in FIGS. 7A and 7B to FIG. 11, like the above, the curved portion is the rear side of the article M, whereas the side facing the curved portion is the front side.

Figure 7A:
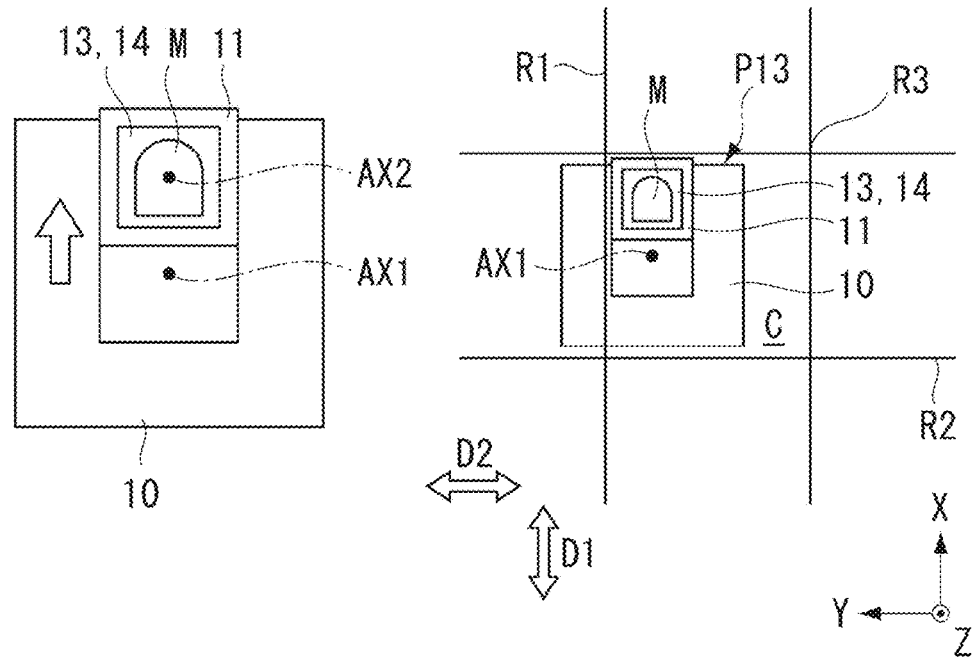
FIGS. 7A and 7B are plan views illustrating an example of a relation between the sliding movement direction of the lateral slider and an orientation of an article.
Figure 7B:
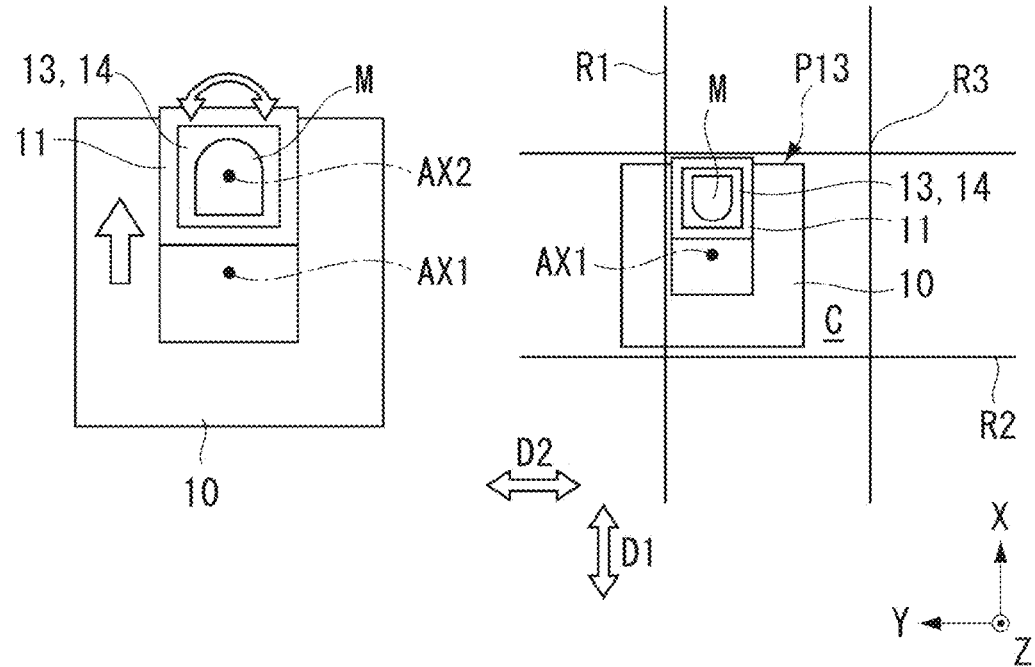

In the examples illustrated in FIGS. 7A and 7B, the article M is at a position deviated to the +X side and the +Y side from the central portion of the cell C in a plan view. At the transfer destination illustrated in FIG. 7A (the load port LP of the processing apparatus PA, for example), it is designated in advance that the article M is positioned with the front side of the article M directed to the −X side, whereas at the transfer destination illustrated in FIG. 7B (the load port LP of the processing apparatus PA, for example), it is designated in advance that the article M is positioned with the front side of the article M directed to the +X side.

In the example illustrated in FIG. 7A, after traveling along the second track R2 and stopping traveling at a transfer position P13, the main body 10 rotates the lateral slider 11 around the first perpendicular axis AX1 by the first rotational driver 15 (refer to FIG. 1) so as to enable the lateral slider 11 to slidingly move toward the +X side, and then slidingly moves the lateral slider 11 toward the +X side. In this case, the front side of the article M held by the article holder 13 is directed to the −X direction (refer to the left drawing in FIG. 7A), and thus the article holder 13 is lowered by the hoisting-and-lowering driver 14, such that the article M can be positioned at the transfer destination with the front side of the article M directed to the −X direction.

In the example illustrated in FIG. 7B, the main body 10, like FIG. 7A, rotates the lateral slider 11 around the first perpendicular axis AX1 at the transfer position P13, and then slidingly moves the lateral slider 11 toward the +X side. In this case, the front side of the article M held by the article holder 13 is directed to the −X direction (refer to the left drawing in FIG. 7B), whereas it is designated that the front side of the article M is directed to the +X direction at the transfer destination. Consequently, the hoisting-and-lowering driver 14 (the article holder 13) is rotated by 180 degrees around the second perpendicular axis AX2 by the second rotational driver 16 (refer to FIG. 1), such that the front side of the article M is directed to the +X direction. Subsequently, the article holder 13 is lowered by the hoisting-and-lowering driver 14, such that the article M can be positioned at the transfer destination with the front side of the article M directed to the +X direction.

Figure 8A:
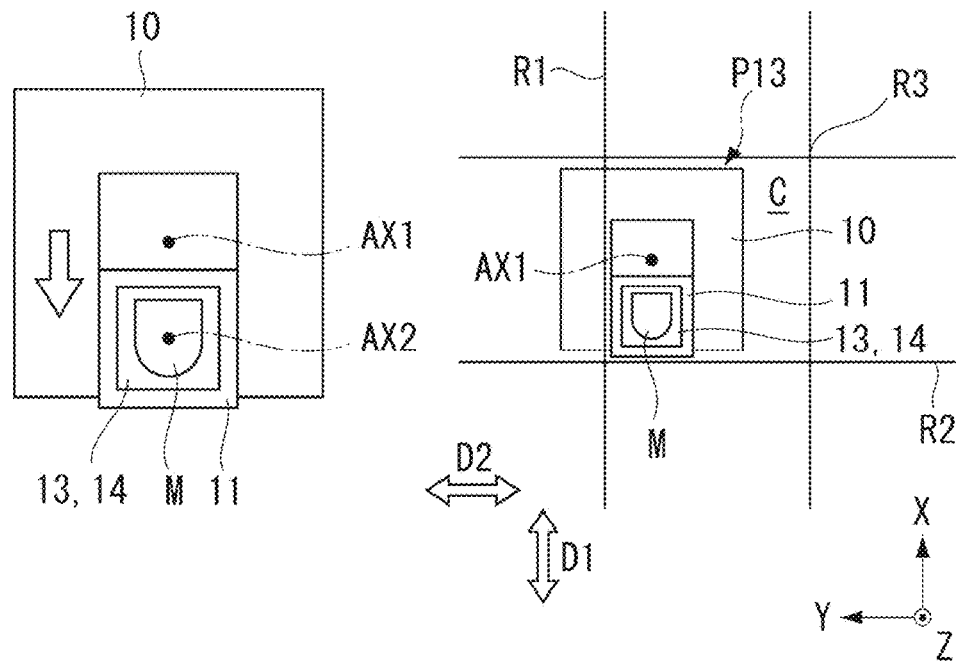
FIGS. 8A and 8B are plan views illustrating another example of the relation between the sliding movement direction of the lateral slider and the orientation of the article.
Figure 8B:
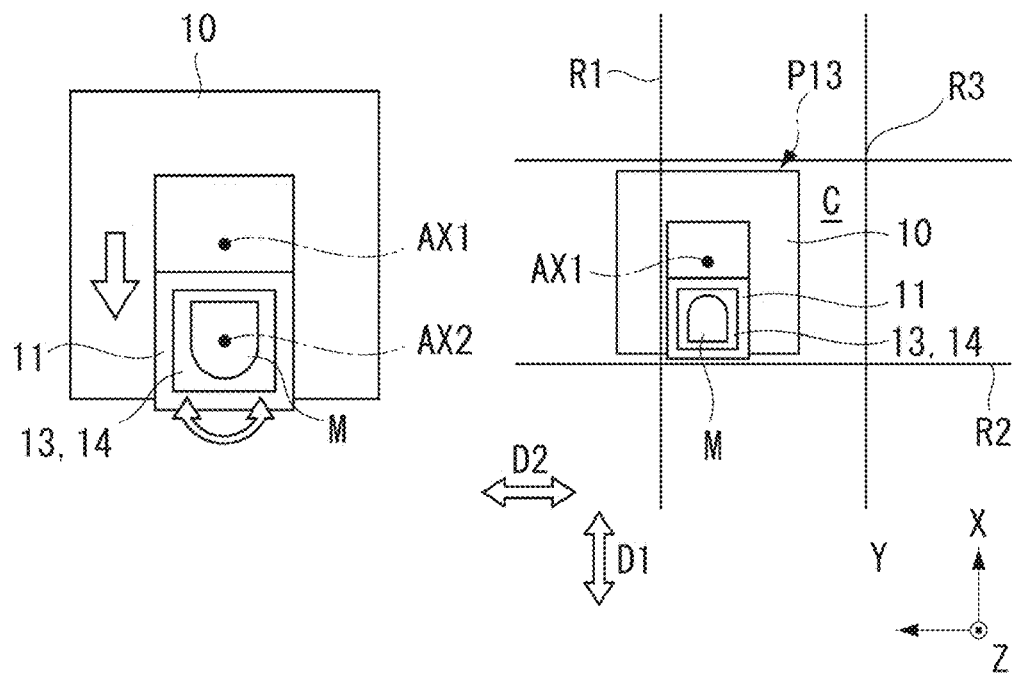

In the examples illustrated in FIGS. 8A and 8B, the article M is at a position deviated to the −X side and the +Y side from the central portion of the cell C in a plan view. At the transfer destination illustrated in FIG. 8A (the load port LP of the processing apparatus PA, for example), it is designated in advance that the article M is positioned with the front side of the article M directed to the +X side, whereas at the transfer destination illustrated in FIG. 8B (the load port LP of the processing apparatus PA, for example), it is designated in advance that the article M is positioned with the front side of the article M directed to the −X side.

In the example illustrated in FIG. 8A, after traveling along the second track R2 and stopping traveling at the transfer position P13, the main body 10 rotates the lateral slider 11 around the first perpendicular axis AX1 by the first rotational driver 15 (refer to FIG. 1) so as to enable the lateral slider 11 to slidingly move toward the −X side, and then slidingly moves the lateral slider 11 toward the −X side. In this case, the front side of the article M held by the article holder 13 is directed to the +X direction (refer to the left drawing in FIG. 8A), and thus the article holder 13 is lowered by the hoisting-and-lowering driver 14, such that the article M can be positioned at the transfer destination with the front side of the article M directed to the +X direction.

In the example illustrated in FIG. 8B, the main body 10, like FIG. 8A, rotates the lateral slider 11 around the first perpendicular axis AX1 at the transfer position P13, and then slidingly moves the lateral slider 11 toward the −X side. In this case, the front side of the article M held by the article holder 13 is directed to the +X direction (refer to the left drawing in FIG. 8B), whereas it is designated that the front side of the article M is directed to the −X direction at the transfer destination. Consequently, the hoisting-and-lowering driver 14 (the article holder 13) is rotated by 180 degrees around the second perpendicular axis AX2 by the second rotational driver 16 (refer to FIG. 1), such that the front side of the article M is directed to the −X direction. Subsequently, the article holder 13 is lowered by the hoisting-and-lowering driver 14, such that the article M can be positioned at the transfer destination with the front side of the article M directed to the −X direction.

Figure 9A:
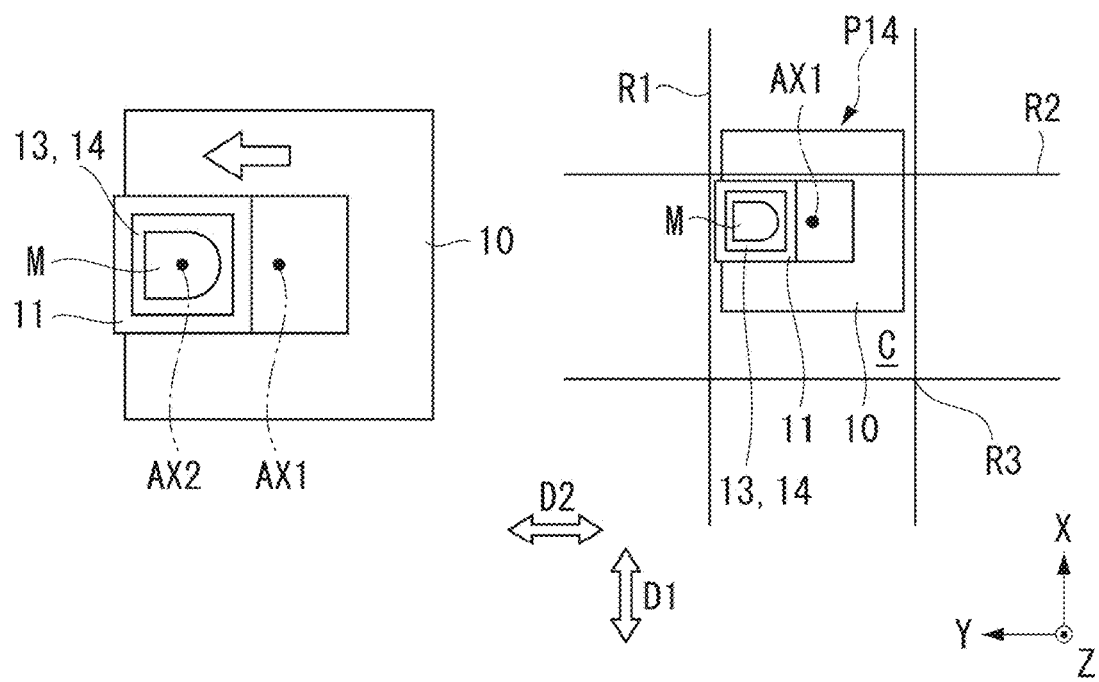
FIGS. 9A and 9B are plan views illustrating another example of the relation between the sliding movement direction of the lateral slider and the orientation of the article.
Figure 9B:
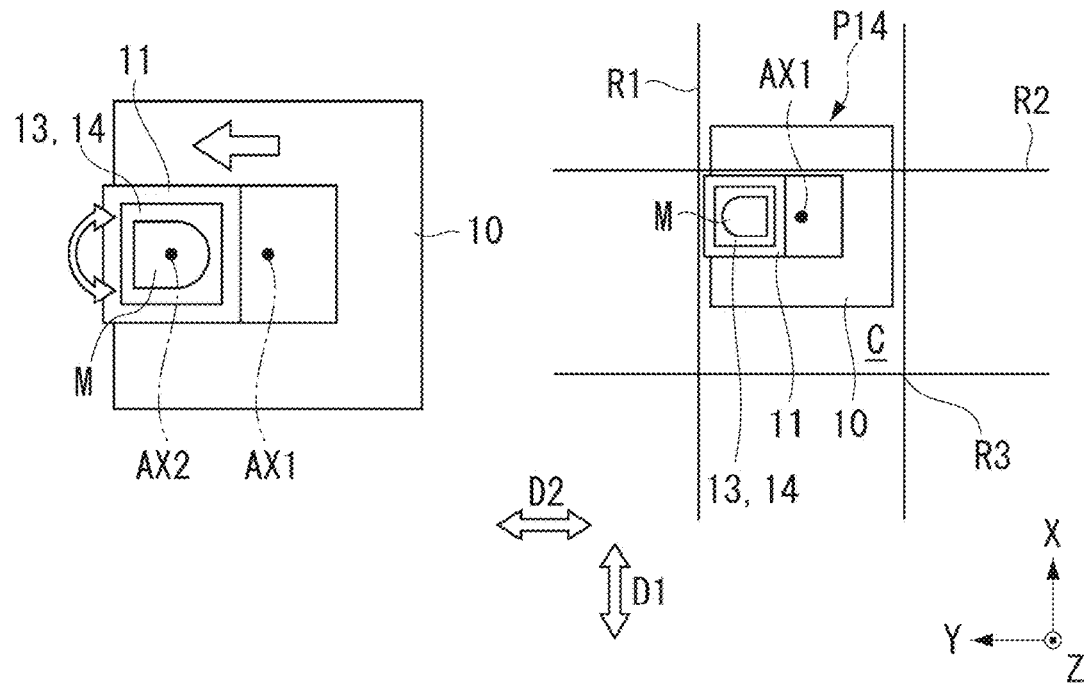

In the examples illustrated in FIGS. 9A and 9B, the article M is at a position deviated to the +X side and the +Y side from the central portion of the cell C in a plan view. At the transfer destination illustrated in FIG. 9A (the load port LP of the processing apparatus PA, for example), it is designated in advance that the article M is positioned with the front side of the article M directed to the +Y side, whereas at the transfer destination illustrated in FIG. 9B (the load port LP of the processing apparatus PA, for example), it is designated in advance that the article M is positioned with the front side of the article M directed to the −Y side.

In the example illustrated in FIG. 9A, after traveling along the first track R1 and stopping traveling at a transfer position P14, the main body 10 rotates the lateral slider 11 around the first perpendicular axis AX1 by the first rotational driver 15 (refer to FIG. 1) so as to enable the lateral slider 11 to slidingly move toward the +Y side, and then slidingly moves the lateral slider 11 toward the +Y side. In this case, the front side of the article M held by the article holder 13 is directed to the +Y direction (refer to the left drawing in FIG. 9A), and thus the article holder 13 is lowered by the hoisting-and-lowering driver 14, such that the article M can be positioned at the transfer destination with the front side of the article M directed to the +Y direction.

In the example illustrated in FIG. 9B, the main body 10, like FIG. 9A, rotates the lateral slider 11 around the first perpendicular axis AX1 at the transfer position P14, and then slidingly moves the lateral slider 11 toward the +Y side. In this case, the front side of the article M held by the article holder 13 is directed to the +Y direction (refer to the left drawing in FIG. 9B), whereas it is designated that the front side of the article M is directed to the −Y direction at the transfer destination. Consequently, the hoisting-and-lowering driver 14 (the article holder 13) is rotated by 180 degrees around the second perpendicular axis AX2 by the second rotational driver 16 (refer to FIG. 1), such that the front side of the article M is directed to the −Y direction. Subsequently, the article holder 13 is lowered by the hoisting-and-lowering driver 14, such that the article M can be positioned at the transfer destination with the front side of the article M directed to the −Y direction.

Figure 10A:
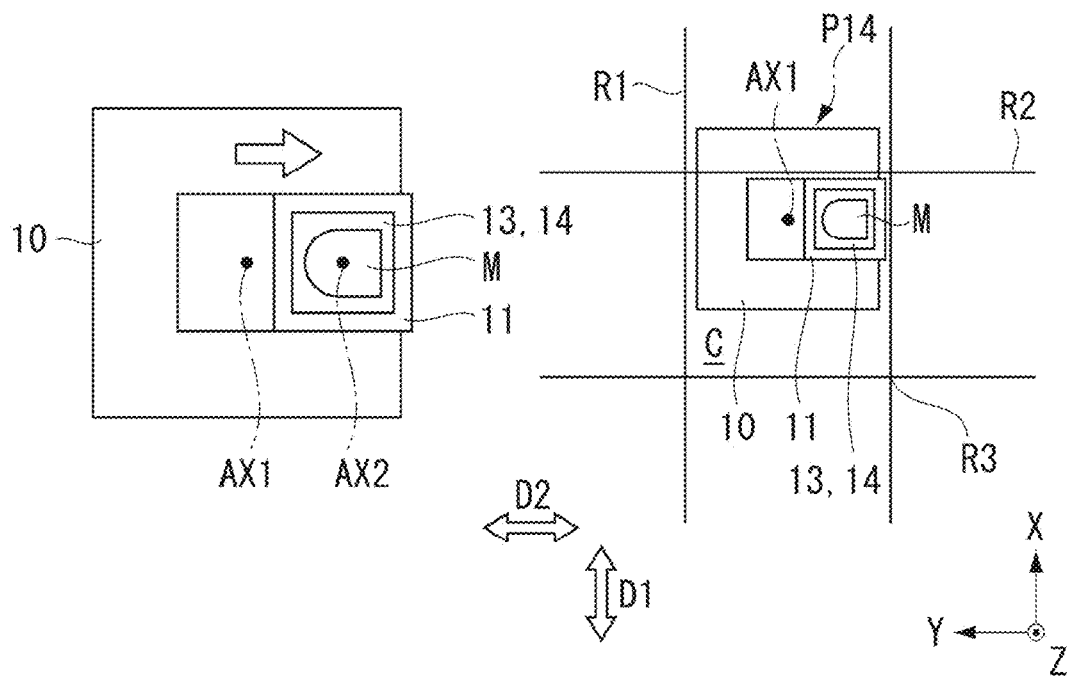
FIGS. 10A and 10B are plan views illustrating another example of the relation between the sliding movement direction of the lateral slider and the orientation of the article.
Figure 10B:
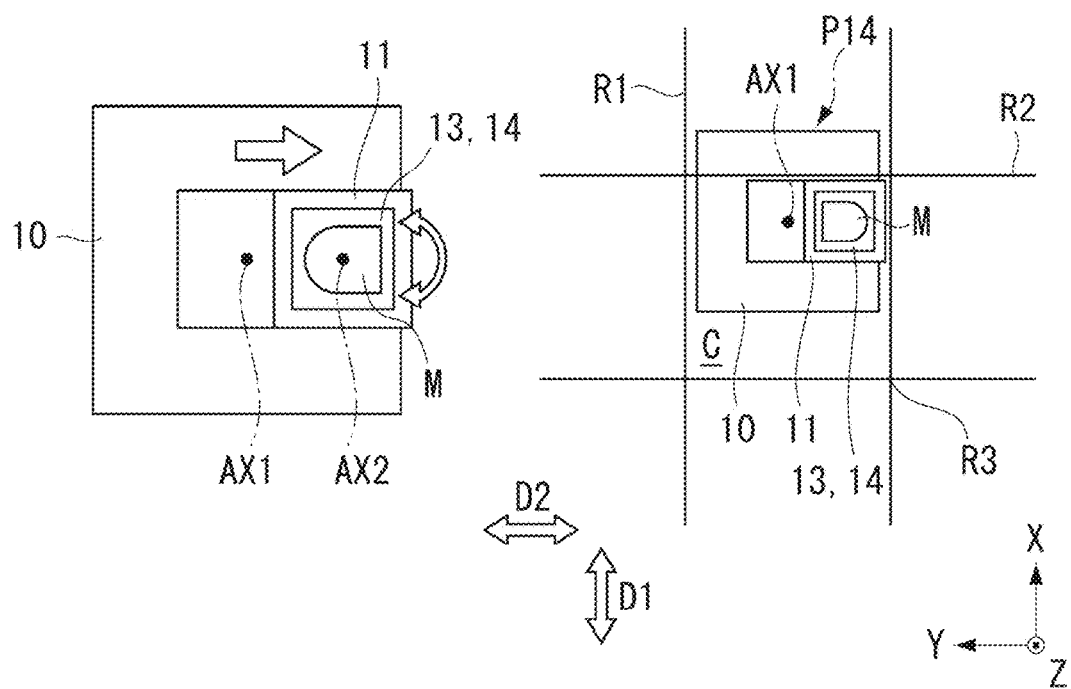

In the examples illustrated in FIGS. 10A and 10B, the article M is at a position deviated to the +X side and the −Y side from the central portion of the cell C in a plan view. At the transfer destination illustrated in FIG. 10A (the load port LP of the processing apparatus PA, for example), it is designated in advance that the article M is positioned with the front side of the article M directed to the −Y side, whereas at the transfer destination illustrated in FIG. 10B (the load port LP of the processing apparatus PA, for example), it is designated in advance that the article M is positioned with the front side of the article M directed to the +Y side.

In the example illustrated in FIG. 10A, after traveling along the first track R1 and stopping traveling at the transfer position P14, the main body 10 rotates the lateral slider 11 around the first perpendicular axis AX1 by the first rotational driver 15 (refer to FIG. 1) so as to enable the lateral slider 11 to slidingly move toward the −Y side, and then slidingly moves the lateral slider 11 toward the −Y side. In this case, the front side of the article M held by the article holder 13 is directed to the −Y direction (refer to the left drawing in FIG. 10A), and thus the article holder 13 is lowered by the hoisting-and-lowering driver 14, such that the article M can be positioned at the transfer destination with the front side of the article M directed to the −Y direction.

In the example illustrated in FIG. 10B, the main body 10, like FIG. 10A, rotates the lateral slider 11 around the first perpendicular axis AX1 at the transfer position P14, and then slidingly moves the lateral slider 11 toward the −Y side. In this case, the front side of the article M held by the article holder 13 is directed to the −Y direction (refer to the left drawing in FIG. 10B), whereas it is designated that the front side of the article M is directed to the +Y direction at the transfer destination. Consequently, the hoisting-and-lowering driver 14 (the article holder 13) is rotated by 180 degrees around the second perpendicular axis AX2 by the second rotational driver 16 (refer to FIG. 1), such that the front side of the article M is directed to the +Y direction. Subsequently, the article holder 13 is lowered by the hoisting-and-lowering driver 14, such that the article M can be positioned at the transfer destination with the front side of the article M directed to the +Y direction.

Figure 11:
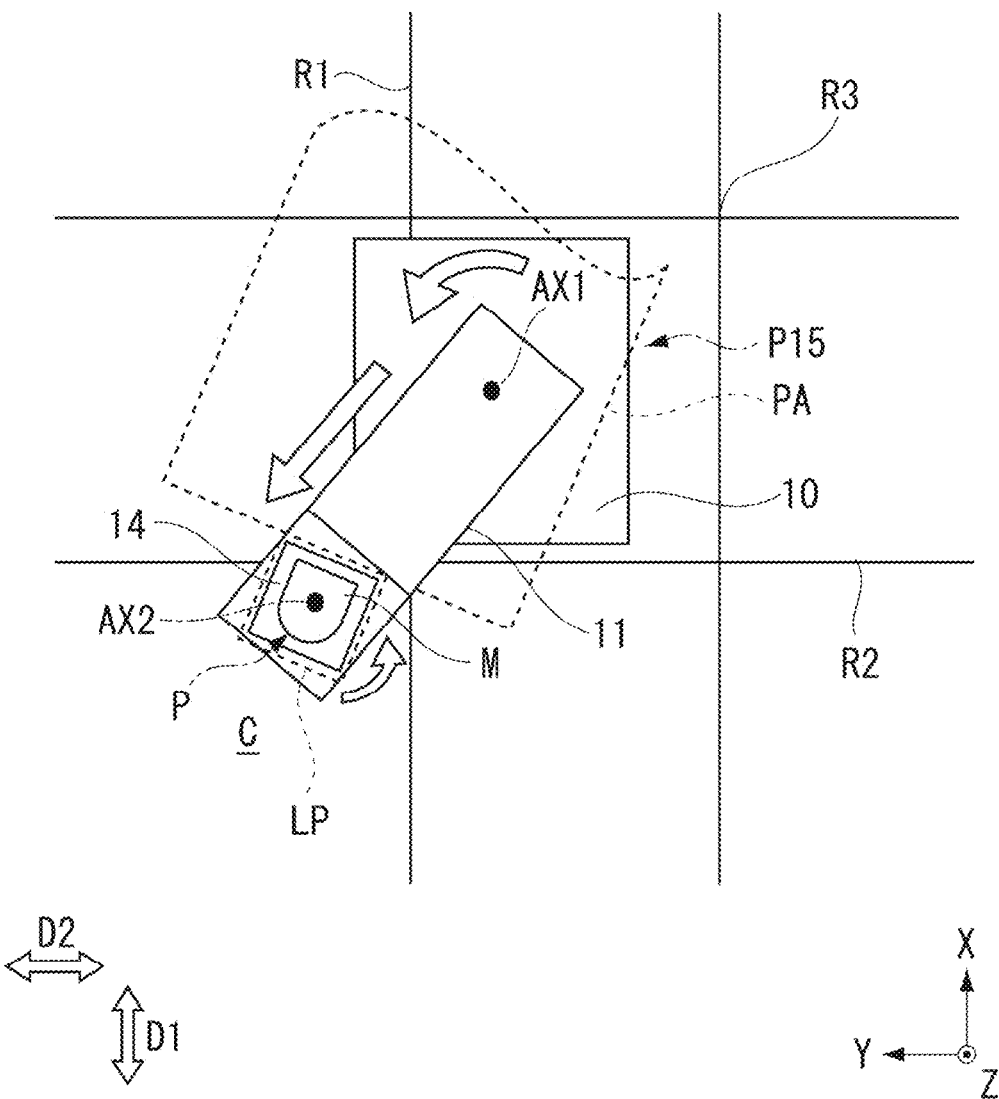
FIG. 11 is a plan view illustrating another example of the relation between the sliding movement direction of the lateral slider and the orientation of the article.

In the example illustrated in FIG. 11, the article M can be at a position deviated to the +X side and the −Y side from the central portion of the cell C (the cell C at the lower left of the drawing) in a plan view. In FIG. 11, the processing apparatus PA is inclined with respect to the first direction D1 or the second direction D2, and the load port LP of this processing apparatus PA is also inclined with respect to the first direction D1 or the second direction D2. The load port LP is like the above in that it is designated in advance that the article M is positioned with the front side of the article M directed to the processing apparatus PA.

As illustrated in FIG. 11, after traveling along the second track R2 and stopping traveling at a transfer position P15, the main body 10 rotates the lateral slider 11 around the first perpendicular axis AX1 by the first rotational driver 15 (refer to FIG. 1) so as to enable the lateral slider 11 to slidingly move toward the −X side and the +Y side above the load port LP, and then slidingly moves the lateral slider 11 toward the −X side and the +Y side. In this case, the front side of the article M held by the article holder 13 is deviated from the orientation designated at the load port LP illustrated in FIG. 11. Consequently, the hoisting-and-lowering driver 14 (the article holder 13) is rotated around the second perpendicular axis AX2 by the second rotational driver 16 (refer to FIG. 1), such that the front side of the article M is directed to the processing apparatus PA. Subsequently, the article holder 13 is lowered by the hoisting-and-lowering driver 14, such that the article M can be positioned at the load port LP with the front side of the article M directed to the processing apparatus PA.

Although in the example illustrated in FIG. 11 the orientation of the article M is aligned with the orientation of the load port LP using both the rotation of the lateral slider 11 by the first rotational driver 15 and the rotation of the hoisting-and-lowering driver 14 by the second rotational driver 16, this aspect is not limiting. At the load port LP illustrated in FIG. 11, the transfer position P15 at which the main body 10 stops is adjusted, such that the orientation of the article M may be able to be aligned with the orientation of the load port LP using only the rotation of the lateral slider 11 by the first rotational driver 15, for example. In FIG. 11, the transfer position P15 of the main body 10 is shifted toward the +Y side from the position illustrated in FIG. 11, and the direction of the sliding movement of the lateral slider 11 and the orientation of the article M designated at the load port LP are aligned, such that the article M may be able to be positioned at the load port LP without rotating the hoisting-and-lowering driver 14, for example.

FIGS. 7A and 7B to FIG. 11 illustrate examples in which the article M can be positioned at the transfer destination with the orientation of the article M aligned with the orientation designated by the transfer destination, and the same holds true for cases not illustrated. That is, rotating the lateral slider 11 around the first perpendicular axis AX1 by the first rotational driver 15 and rotating the hoisting-and-lowering driver 14 (the article holder 13) around the second perpendicular axis AX2 by the second rotational driver 16 can position the article M with the orientation designated by the transfer destination deviated from the central portion of the cell C in a plan view. Consequently, according to the present preferred embodiment, the degree of freedom of the relative position between the grid-shaped track R (the track) and the load port LP (the processing apparatus PA) can be improved, and in addition, the degree of freedom for a position and a direction at which and in which the processing apparatus PA is installed (the position and the direction of the load port LP) can also be improved. That is, when the orientation of the article M to be positioned at the load port LP is determined in advance like the processing apparatus PA, the position and the orientation of the load port LP as the transfer destination of the article M (the position and the orientation of the processing apparatus PA) can be set relatively freely with respect to the grid-shaped track R, and thus space efficiency can be improved, including relaxation of limitations on installation of the processing apparatus PA on the surface of a floor.

In the present preferred embodiment, a time at which the hoisting-and-lowering driver 14 (the article holder 13) is rotated by the second rotational driver 16 may be the time during which the main body 10 is traveling along the grid-shaped track R or the lateral slider 11 is slidingly moving. Another example of a time at which the lateral slider 11 is rotated by the first rotational driver 15 will be described below.

Thus, according to the ceiling conveyance vehicle 100 and the ceiling conveyance vehicle system SYS according to the present preferred embodiment, the lateral slider 11 is rotatable around the first perpendicular axis AX1 with respect to the main body 10, and thus the lateral slider 11 can be slidingly moved in a desired direction when the traveling direction of the main body 10 is any one of the first track R1 and the second track R2. Consequently, even when the direction of the sliding movement by the lateral slider 11 and the traveling direction of the main body 10 match, the article holder 13 can be moved in a direction other than the traveling direction such as a direction perpendicular or substantially perpendicular to the traveling direction, and the transfer position of the article M can easily be adjusted.

Second Preferred Embodiment

Figure 12:
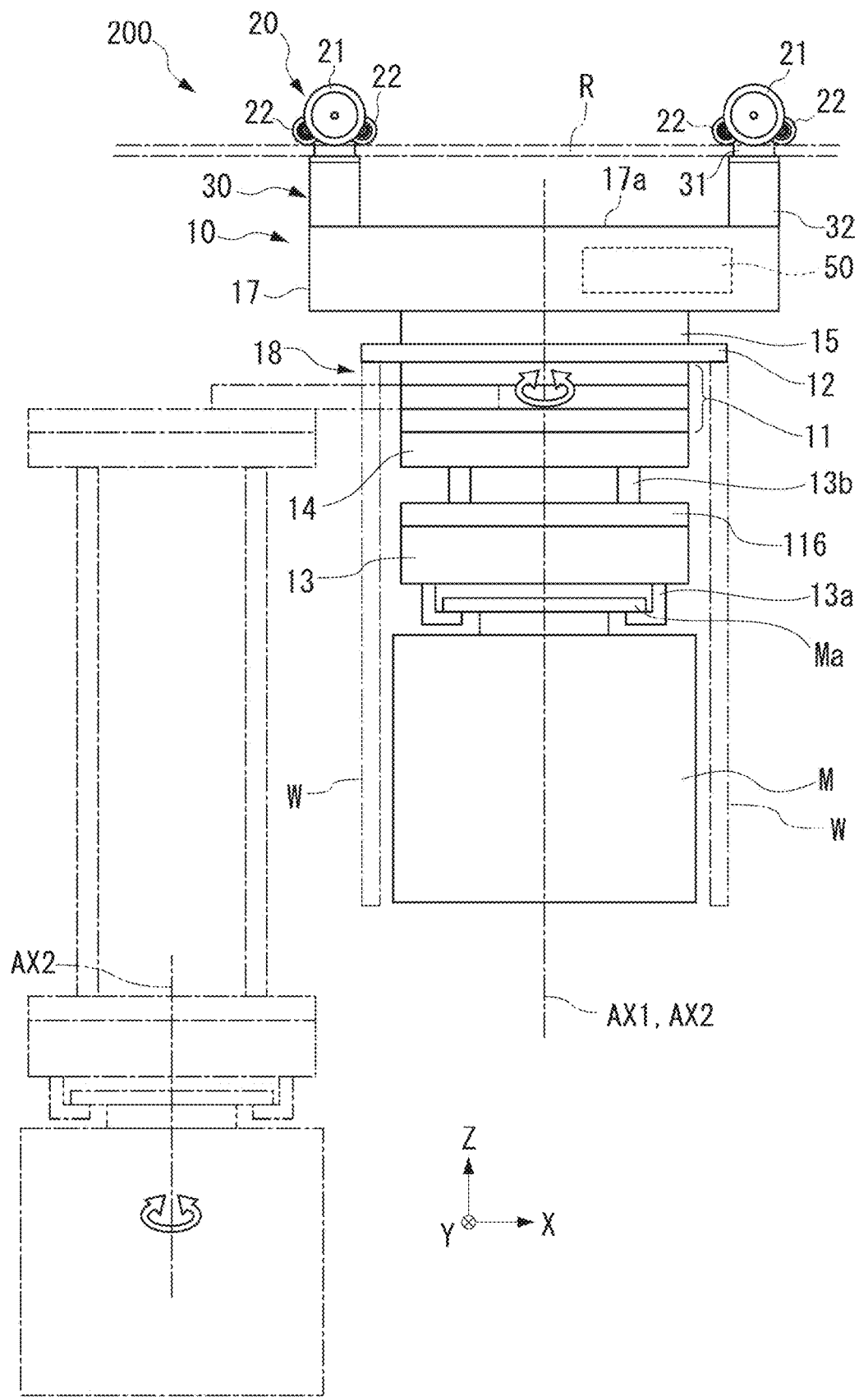
FIG. 12 is a side view illustrating an example of a ceiling traveling vehicle according to a second preferred embodiment of the present invention.

FIG. 12 is a side view illustrating an example of a ceiling conveyance vehicle 200 according to a second preferred embodiment. Although the first preferred embodiment describes a case in which the hoisting-and-lowering driver 14 is rotated around the second perpendicular axis AX2 by the second rotational driver 16 as an example, this aspect is not limiting; the article holder 13 may be rotated. As illustrated in FIG. 11, in the ceiling conveyance vehicle 200 according to the second preferred embodiment, the main body 10 includes a second rotational driver 116 rotating the article holder 13 around the second perpendicular axis AX2. In the ceiling conveyance vehicle 200, components similar to those of the ceiling conveyance vehicle 100 of the first preferred embodiment are denoted by the same symbols, and descriptions thereof are omitted or simplified.

The second rotational driver 116 is connected to the lowermost portion of the hanger 13b and is on the article holder 13. The second rotational driver 116, for which an electric motor or the like is used, for example, rotates the article holder 13 in a range of at least 180 degrees around the second perpendicular axis AX2 from one direction out of directions perpendicular or substantially perpendicular to the linear direction in which the lateral slider 11 slidingly moves. Consequently, the article M held by the article holder 13 can be rotated in a range of 180 degrees around the second perpendicular axis AX2 to direct the front side of the article M to an opposite direction.

With the ceiling conveyance vehicle 200 of the present preferred embodiment, like the ceiling conveyance vehicle 100, the transfer position of the article M can easily be adjusted. The second rotational driver 116 rotates the article holder 13 around the second perpendicular axis AX2, and thus the rotation path of the article M is shorter than that of a case in which the hoisting-and-lowering driver 14 is rotated, and thus when the article M is rotated after the article holder 13 has been lowered in particular, the responsiveness of the rotation of the article M during the drive of the second rotational driver 116 is high, and the orientation of the article M can be adjusted in a short time.

Figure 13A:
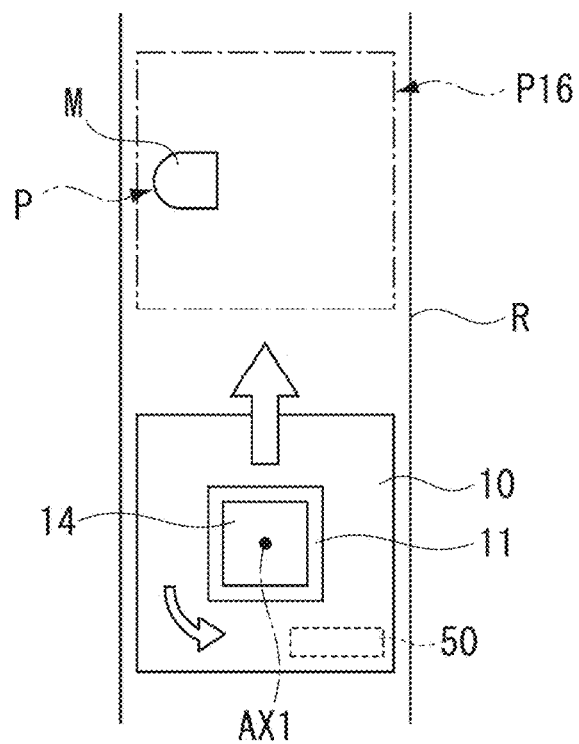
FIGS. 13A and 13B are plan views illustrating an example in which the lateral slider is rotated when the main body is traveling.
Figure 13B:
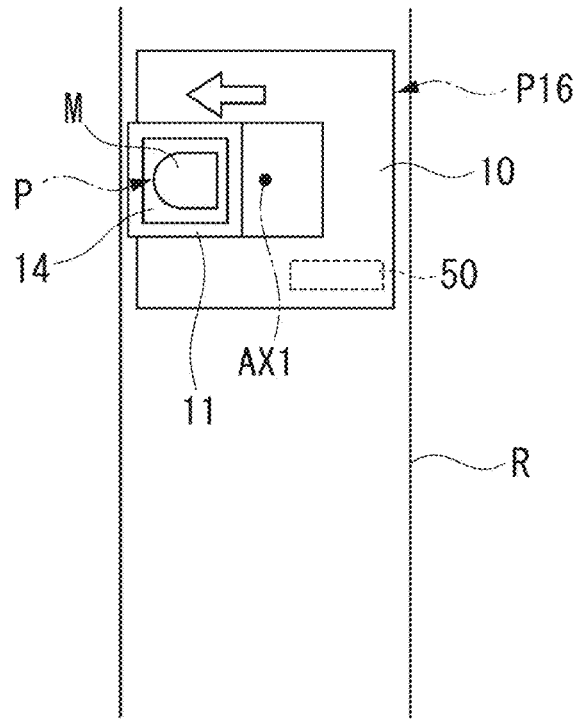

Although the first and second preferred embodiments describe an example in which the main body 10 has stopped at the transfer position, and then the sliding movement of the lateral slider 11 is performed, this operation is not limiting. FIGS. 13A and 13B are plan views illustrating an example of timing between the traveling of the main body 10 and the sliding movement of the lateral slider 11. As illustrated in FIG. 13A, while the main body 10 is traveling along the grid-shaped track (the track) R toward a transfer position P16 in order to transfer the article M to a transfer destination P, the controller 50 may drive the first rotational driver 15 to rotate the lateral slider 11 around the first perpendicular axis AX1.

When acquiring information on the transfer position P16, the controller 50 acquires information on the transfer destination P from a host controller or the like. After stopping at the transfer position P16, the controller 50 acquires the direction of the sliding movement by the lateral slider 11 from the information on the transfer destination P. Consequently, the controller 50 rotates the lateral slider 11 while the main body 10 is traveling, and can start the sliding movement of the lateral slider 11 in a short time after the stopping of the main body 10 or at the same time with the stopping and reduce the time required for the transfer of the article M. When the lateral slider 11 uses one-sided sliding movement in particular, the lateral slider 11 is rotated in a range of 270 degrees, and thus rotation of the lateral slider 11 is executed while the main body 10 is traveling, such that a reduction in the transfer time of the article M can be achieved.

The controller 50 need not correctly acquire the direction of the sliding movement by the lateral slider 11. The controller 50 may roughly calculate the direction of the sliding movement from the coordinates of the transfer position P16 and the transfer destination P and rotate the lateral slider 11 toward the direction, for example. Also in this case, adjustment of a rotational position of the lateral slider 11 is completed in a short time after the stopping at the transfer position P16, and thus the time required for the transfer of the article M can be reduced. The controller 50 may set the rotational position of the lateral slider 11 such that the linear direction in which the lateral slider 11 slidingly moves and the transfer destination P overlap with each other in a plan view when the main body 10 has stopped at the transfer position P16. In this configuration, as illustrated in FIG. 13B, after the main body 10 has reached the transfer position P16, the sliding movement (the one-sided sliding movement) by the lateral slider 11 can immediately be started, and a transfer operation for the article M can quickly be performed after the main body 10 has reached the transfer position P16.

Although the preferred embodiments have been described, the present invention is not limited to the description described above, and various modifications can be made to the extent not departing from the gist of the present invention. Although the preferred embodiments described above describe a configuration in which the main body 10 includes the second rotational driver 16 or 116 as an example, this configuration is not limiting. The main body 10 may not necessarily include the second rotational driver 16 or 116. When the article M has no directivity (when the article bears a similar aspect regardless of the orientation thereof) or when the orientation of the article M is not designated in a transfer destination, for example, even the ceiling conveyance vehicle 100 not including the second rotational driver 16 or 116 can easily adjust the transfer position of the article M like the preferred embodiments.

Although the preferred embodiments describe a configuration in which the direction changer 34 rotates the coupler 30 around the turning axis AX3 with respect to the main body 10 to switch between the first state, in which the traveling wheel 21 travels along the first track R1, and the second state, in which the traveling wheel 21 travels along the second track R2, as an example, this configuration is not limiting. A first traveling wheel traveling along the first track R1 and a second traveling wheel traveling along the second track R2 may separately be provided, and the first traveling wheel and the second traveling wheel may be used in a switching manner in accordance with the traveling direction of the main body 10, for example.

Although the preferred embodiments describe the grid-shaped track R in which the first track R1 (the first direction D1) and the second track R2 (the second direction D2) are perpendicular or substantially perpendicular to each other as an example, this configuration is not limiting. The track R may be an aspect in which the first track R1 and the second track R2 are not perpendicular or substantially perpendicular to each other, for example. Without being limited to the aspect being the grid-shaped track R in which the first track R1 and the second track R2 cross each other, the track R may be an aspect in which the second track R2 is bent from an end of the first track R1, for example.

To the extent permitted by law, the contents of Japanese Patent Application No. 2018-203024 as a Japanese patent application and all the literature cited in the present specification are hereby incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A ceiling conveyance vehicle comprising:
 a traveling wheel to roll on a track including a first track extending in a first direction and a second track extending in a second direction different from the first direction;
 a main body below the track and coupled to the traveling wheel;
 a direction changer to change between a first state in which the traveling wheel rolls on the first track and a second state in which the traveling wheel rolls on the second track, with an orientation of the main body with respect to the track maintained;
 an article holder capable of holding an article;
 a hoisting-and-lowering driver to hoist and lower the article holder;
 a lateral slider to slidingly move the hoisting-and-lowering driver in a horizontal, linear direction; and
 a first rotational driver to rotationally drive the lateral slider around a first perpendicular axis with respect to the main body; wherein
 the track is a grid-shaped track in which the first direction and the second direction are perpendicular or substantially perpendicular to each other;
 the lateral slider one-sidedly slidingly moves the hoisting-and-lowering driver in one direction in the linear direction; and
 the first rotational driver rotates the lateral slider in a range of 270 degrees around the first perpendicular axis from a state in which a direction of one-sided sliding movement of the lateral slider is aligned with the first direction or the second direction.

2. The ceiling conveyance vehicle according to claim 1, further comprising a second rotational driver to rotationally drive the article holder or the hoisting-and-lowering driver around a second perpendicular axis with respect to the lateral slider.

3. The ceiling conveyance vehicle according to claim 2, wherein the second rotational driver rotates the article holder or the hoisting-and-lowering driver in a range of at least 180 degrees around the second perpendicular axis based on the linear direction.

4. The ceiling conveyance vehicle according to claim 1, further comprising a controller to drive the first rotational driver to rotate the lateral slider around the first perpendicular axis while moving toward a transfer position to perform transfer of an article with respect to a transfer destination.

5. The ceiling conveyance vehicle according to claim 4, wherein the controller sets a rotational position of the lateral slider such that the linear direction in which the lateral slider slidingly moves and the transfer destination overlap with each other in a plan view when the main body has stopped at the transfer position.

6. A ceiling conveyance vehicle system comprising:
   a track including a first track extending in a first direction and a second track extending in a second direction different from the first direction; and
   a ceiling conveyance vehicle including:
      a traveling wheel to roll on the track;
      a main body below the track and coupled to the traveling wheel;
      a direction changer to change between a first state in which the traveling wheel rolls on the first track and a second state in which the traveling wheel rolls on the second track, with an orientation of the main body with respect to the track maintained;
      an article holder capable of holding an article;
      a hoisting-and-lowering driver to hoist and lower the article holder;
      a lateral slider to slidingly move the hoisting-and-lowering driver in a horizontal, linear direction; and
      a first rotational driver to rotationally drive the lateral slider around a first perpendicular axis with respect to the main body; wherein
   the track is a grid-shaped track in which the first direction and the second direction are perpendicular or substantially perpendicular to each other;
   the lateral slider one-sidedly slidingly moves the hoisting-and-lowering driver in one direction in the linear direction; and
   the first rotational driver rotates the lateral slider in a range of 270 degrees around the first perpendicular axis from a state in which a direction of one-sided sliding movement of the lateral slider is aligned with the first direction or the second direction.

* * * * *